(12) United States Patent
Bader et al.

(10) Patent No.: US 11,522,080 B2
(45) Date of Patent: Dec. 6, 2022

(54) HIGH-VOLTAGE P-CHANNEL FET BASED ON III-NITRIDE HETEROSTRUCTURES

(71) Applicant: Cornell University, Ithaca, NY (US)

(72) Inventors: Samuel James Bader, Ithaca, NY (US); Reet Chaudhuri, Ithaca, NY (US); Huili Grace Xing, Ithaca, NY (US); Debdeep Jena, Ithaca, NY (US)

(73) Assignee: Cornell University, Ithaca, NY (US)

( * ) Notice: Subject to any disclaimer, the term of this patent is extended or adjusted under 35 U.S.C. 154(b) by 333 days.

(21) Appl. No.: 16/676,083

(22) Filed: Nov. 6, 2019

(65) Prior Publication Data

US 2020/0144407 A1   May 7, 2020

Related U.S. Application Data

(60) Provisional application No. 62/756,874, filed on Nov. 7, 2018.

(51) Int. Cl.
| | | |
|---|---|---|
| *H01L 29/778* | (2006.01) |
| *H01L 27/092* | (2006.01) |
| *H01L 29/20* | (2006.01) |
| *H01L 29/205* | (2006.01) |
| *H01L 29/417* | (2006.01) |
| *H01L 29/66* | (2006.01) |
| *H01L 29/08* | (2006.01) |

(Continued)

(52) U.S. Cl.
CPC ...... *H01L 29/7787* (2013.01); *H01L 21/0254* (2013.01); *H01L 21/28575* (2013.01); *H01L 21/30612* (2013.01); *H01L 27/092* (2013.01); *H01L 29/2003* (2013.01); *H01L 29/205* (2013.01); *H01L 29/41725* (2013.01); *H01L 29/66462* (2013.01); *H01L 29/0847* (2013.01); *H01L 29/1033* (2013.01); *H01L 29/42364* (2013.01); *H01L 29/42376* (2013.01); *H01L 29/452* (2013.01); *H01L 29/495* (2013.01)

(58) Field of Classification Search
CPC ............ H01L 29/7787; H01L 21/0254; H01L 21/28575; H01L 21/30612; H01L 27/092; H01L 29/2003; H01L 29/205; H01L 29/41725; H01L 29/66462; H01L 29/0847; H01L 29/1033; H01L 29/42364; H01L 29/42376; H01L 29/452; H01L 29/495; H01L 29/4236; H01L 29/7781; H01L 21/8252; H01L 27/0605; H01L 27/085
See application file for complete search history.

(56) References Cited

U.S. PATENT DOCUMENTS

| | | | |
|---|---|---|---|
| 8,785,904 B2 | 7/2014 | Zhang | |
| 9,006,791 B2 * | 4/2015 | Kub | ............... H01L 21/0254 |
| | | | 257/E29.253 |

(Continued)

OTHER PUBLICATIONS

Nakajima, A., et al., "High Density Two-Dimensional Hole Gas Induced by Negative at GaN/AlGaN Heterointerface." Applied Physics Express 3 (2010) 121004 [online] <URL: https://iopscience.iop.org/article/10.1143/APEX.3.121004/mata> <DOI: 10.1143/APEX.3.121004.

*Primary Examiner* — Benjamin Tzu-Hung Liu
(74) *Attorney, Agent, or Firm* — Culhane Meadows PLLC; Orlando Lopez

(57) ABSTRACT

III-Nitride heterostructures with low p-type sheet resistance and III-Nitride heterostructure devices with gate recess and devices including the III-Nitride heterostructures are disclosed.

25 Claims, 27 Drawing Sheets

(51) Int. Cl.
    *H01L 29/10*     (2006.01)
    *H01L 29/423*     (2006.01)
    *H01L 29/45*     (2006.01)
    *H01L 29/49*     (2006.01)
    *H01L 21/02*     (2006.01)
    *H01L 21/306*     (2006.01)
    *H01L 21/285*     (2006.01)

(56) References Cited

U.S. PATENT DOCUMENTS

| | | | |
|---|---|---|---|
| 9,087,889 B2 | 7/2015 | Nakajima | |
| 2004/0041169 A1* | 3/2004 | Ren | H01L 29/66522 |
| | | | 257/E29.252 |
| 2006/0244011 A1* | 11/2006 | Saxler | H01L 29/7783 |
| | | | 257/E29.249 |
| 2006/0255364 A1* | 11/2006 | Saxler | H01L 29/2003 |
| | | | 257/E29.093 |
| 2019/0058049 A1* | 2/2019 | Then | H01L 29/2003 |
| 2020/0411677 A1* | 12/2020 | Then | H01L 29/7786 |

\* cited by examiner

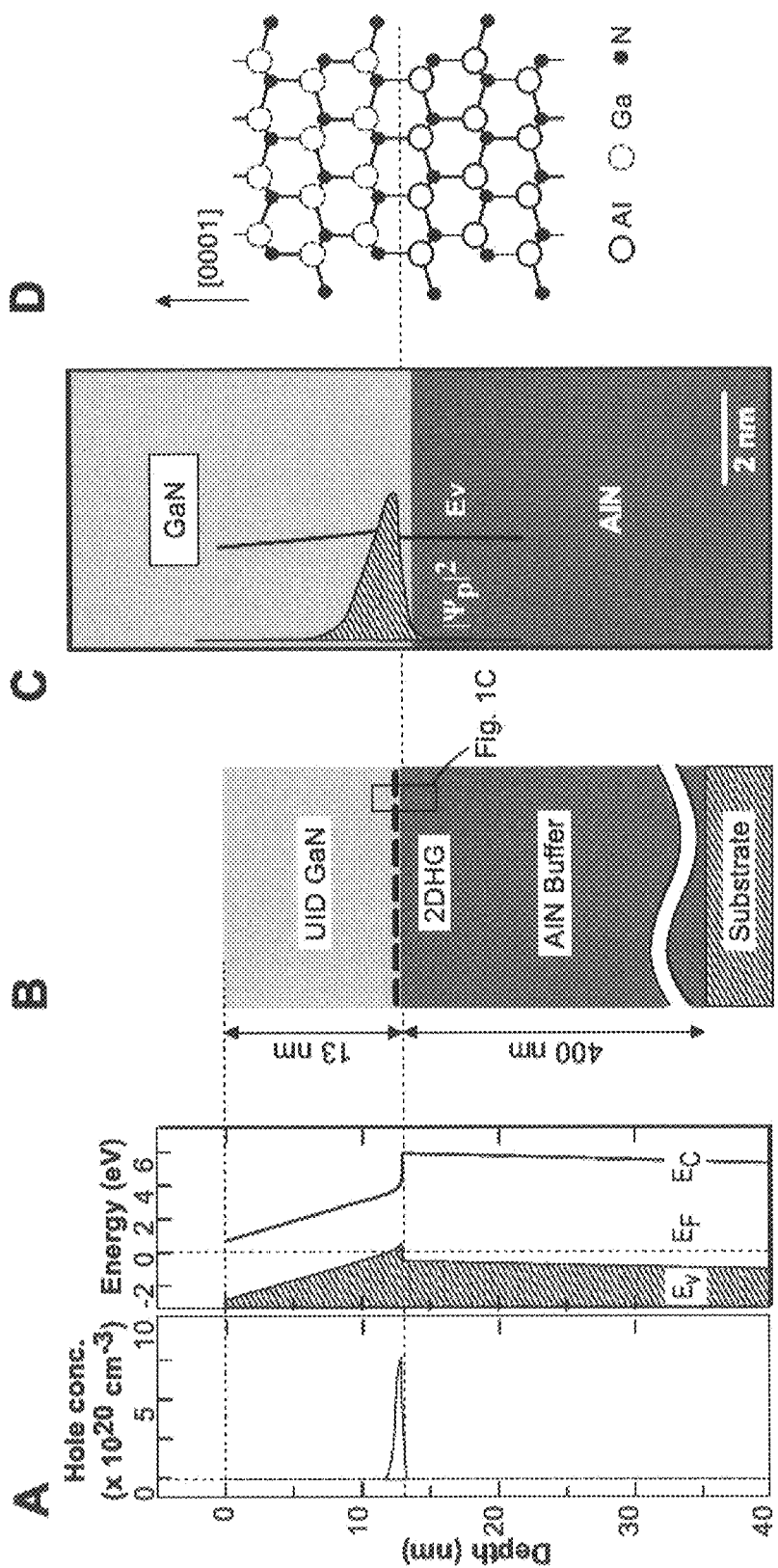

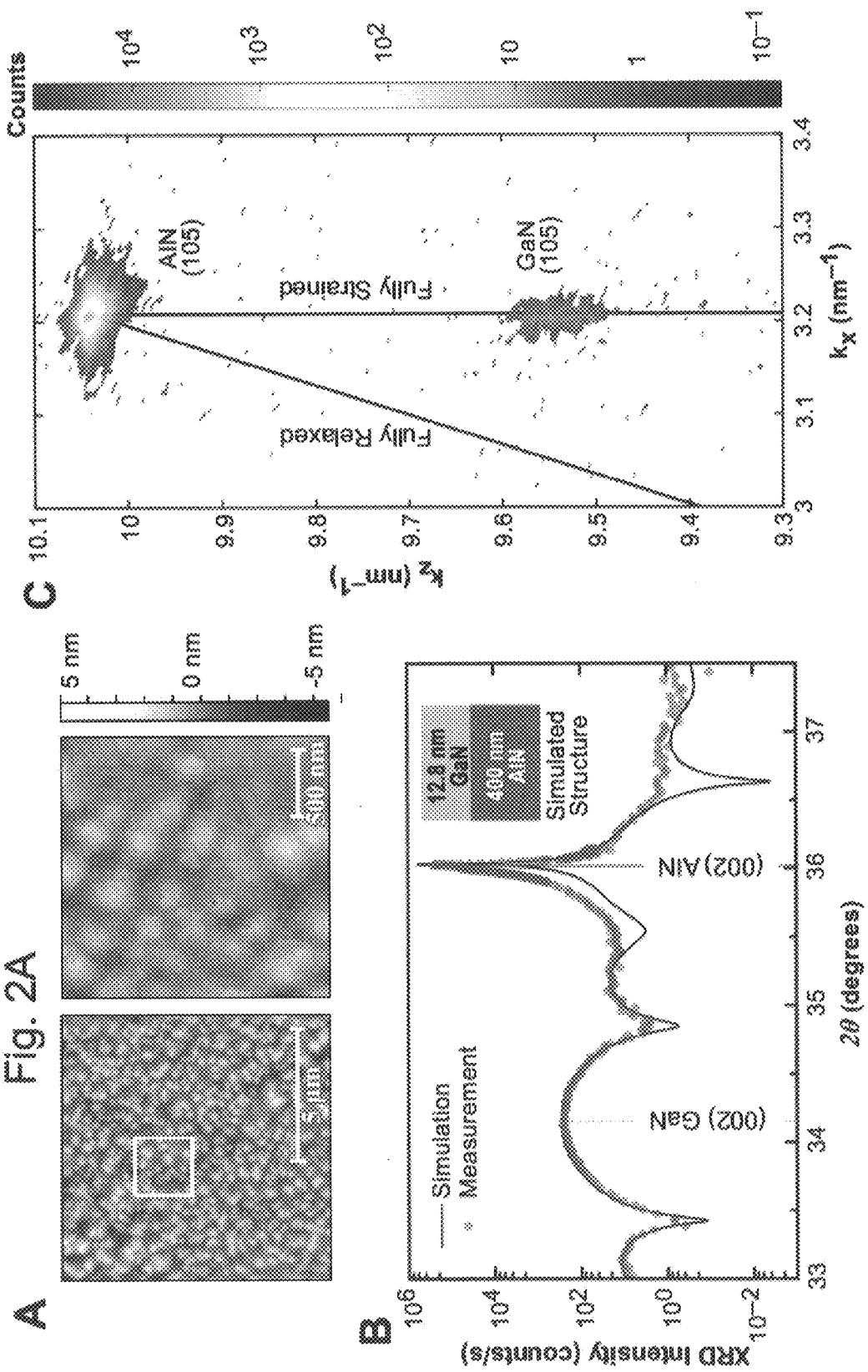

HIGH-VOLTAGE P-CHANNEL FET BASED ON III-NITRIDE HETEROSTRUCTURES

CROSS-REFERENCE TO RELATED APPLICATIONS

This application claims priority to U.S. Provisional Patent Application No. 62/756,874, filed Nov. 7, 2018, entitled A HIGH-VOLTAGE P-CHANNEL FET BASED ON III-NITRIDE HETEROSTRUCTURES, which is incorporated herein by reference in its entirety and for all purposes.

STATEMENT REGARDING FEDERALLY SPONSORED RESEARCH OR DEVELOPMENT

This invention was made with U.S. Government support from the National Science Foundation under grant No. DMR-1710298 and from the Air Force Office of Scientific Research under grant No. AFOSR FA9550-17-1-0048. The U.S. Government has certain rights to the invention.

BACKGROUND

These teachings relate generally to on III-Nitride heterostructures and devices based on III-Nitride heterostructures and III-Nitride heterostructure devices with gate recess.

In general, there are two types of transistors, electron-based and hole-based. In the III-Nitride platform, electron-based transistors have demonstrated high power and high frequency performance that makes the platform highly desirable. But the few hole-based transistors prototyped so far have performed much worse. Having both electron- and hole-based transistors enables many "complementary" circuit techniques which lead to much more efficient circuits and are the backbone of logic in computing devices, but since hole-based transistors are so lacking in the III-Nitrides, such techniques are currently not possible.

From controlling eco-friendly automotive systems, to enabling next-generation communications, to powering more compact and affordable consumer products, major technological shifts place increasingly stringent demands on power and RF electronics. Gallium Nitride (GaN) is on the forefront of realizing these new applications, given that its large bandgap enables high-power operation, and its built-in polarization can induce dense, undoped, high-mobility electron sheets to provide low on-resistance. Nonetheless, these advantages have not yet translated to hole-based devices in GaN, a deficiency which has severely limited the advance of the technology. Since standard techniques based on complementary p- and n-transistors cannot be straightforwardly integrated in GaN, systems designers must often slow down their workhorse n-type transistors to interact safely with external driving circuitry.

This engineering limitation is rooted in the physics of the platform: wide-bandgaps generally lead to heavy valence bands (resulting in lower mobility holes) and deep valence bands, which are difficult to dope and difficult to contact with typical metal work functions. For GaN, the only successful chemical dopant is Mg, which has a large activation energy (0.1-0.2 eV$\gg$kT), so a high dopant density dominates the electrostatics of a device but provides few free carriers. The physics of navigating these challenges coincides with massive industrial interest in advancing power electronics.

The p-doping problem can be addressed as in undoped n-channel devices, by heterostructure design which employs built-in polarization. High "polarization-induced doping" also aids in making contacts, and clever alloy/strain-engineering could mitigate the mobility limitation. Various authors have produced prototypes based on hole-inducing polar heterostructures (such as GaN/AlN [10], GaN/AlGaN, InGaN/GaN, or GaN/AlInGaN). Few of these devices have satisfied the circuit designers' desire for normally-off ("E-mode") operation, wherein the device does not conduct without applied gate bias. Among these, the on-currents (<10 mA/mm) are generally two orders smaller than in similarly sized n-channel devices.

The highest on-currents achieved to date are "normally-on" devices by the GaN/AlN approach, which maximizes the polarization difference. However, the only reported GaN/AlN E-mode device was produced without gate-specific recess. Consequently, the entire device, not only the gated region, was depleted, such that space-charge-limited transport clipped the device performance.

There is a need for III-Nitride heterostructures with low p-type sheet resistance and III-Nitride heterostructure devices with gate recess.

BRIEF SUMMARY

III-Nitride heterostructures with low p-type sheet resistance and III-Nitride heterostructure devices with gate recess and devices including the III-Nitride heterostructures are disclosed hereinbelow.

The III-Nitride heterostructures used herein are the III-Nitride heterostructures disclosed in the publication WO 2020/018895 A1 of PCT application PCT/US2019/042584, filed on Jul. 19, 2019, and which claims priority of U.S. provisional application No. 62/701,219, entitled POLARIZATION-INDUCED 2D HOLE GASES FOR HIGH-VOLTAGE P-CHANNEL TRANSISTORS, and filed on Jul. 20, 2018, both of which are incorporated by reference herein in their entirety and for all purposes.

In one or more embodiments, the Group III nitride semiconductor device of these teachings includes a first layer of a first polar undoped Group III nitride material grown on an undoped substrate material, and a second layer of an undoped second polar Group III nitride material epitaxially grown on the first layer of the first polar undoped Group III nitride material, the two layers constituting an epitaxial structure similar to that the publication WO 2020/018895 A1 of PCT application PCT/US2019/042584, filed on Jul. 19, 2019, and which claims priority of U.S. provisional application No. 62/701,219, entitled POLARIZATION-INDUCED 2D HOLE GASES FOR HIGH-VOLTAGE P-CHANNEL TRANSISTORS, and filed on Jul. 20, 2018. A 2D hole gas forms at a heterojunction between the first layer of the first polar undoped Group III nitride material and the second layer of the undoped second polar Group III nitride material. The Group III nitride semiconductor device of these teachings also includes a first slab of p-doped third polar Group III nitride material disposed on the second layer of the undoped second polar Group III nitride material, a second slab of p-doped third polar Group III nitride material disposed on the second layer of the undoped second polar Group III nitride material, the second slab of p-doped third polar Group III nitride material being spaced apart from the first slab of p-doped third polar Group III nitride material, a first electrically conductive contact disposed over a portion of the first slab of p-doped third polar Group III nitride material. a second electrically conductive contact disposed over a portion of the second slab of p-doped third polar Group III nitride material, and a third electrically conductive contact disposed over a surface of the second layer of the undoped second polar Group III nitride material, the surface being located between the first slab of p-doped third polar Group III nitride material and the second slab of p-doped third polar Group III nitride material and opposite a surface of the first layer of the first polar undoped Group III nitride material on which the second layer of the undoped second polar Group III nitride material is grown, the third electrically conductive contact being disposed away from the first and second electrically conductive contacts.

In other embodiments, the Group III nitride semiconductor device also includes an insulating layer disposed on a section of each one of first slab of p-doped third polar Group III nitride material and the second slab of p-doped third polar Group III nitride material that is not covered by the first electrically conductive contact and the second electrically conductive contact, disposed on a sidewall of the first slab of p-doped third polar Group III nitride material and an opposing sidewall of the second slab of p-doped third polar Group III nitride material, and disposed on the surface of the second layer of the undoped second polar Group III nitride material, the surface being located between the first slab of p-doped third polar Group III nitride material and the second slab of p-doped third polar Group III nitride material, the third electrically conductive contact being disposed over the insulating layer; the third electrically conductive contact being disposed away from the first and second electrically conductive contacts.

In yet other embodiments, the second layer of the undoped second polar Group III nitride material has an indentation extending from a first surface on which the first slab of p-doped third polar Group III nitride material and the second slab of p-doped third polar Group III nitride material are disposed to a second surface disposed between the first surface and a surface in contact with the first layer of a first polar undoped Group III nitride material; the indentation disposed between the first and second slabs of p-doped second polar Group III nitride material, and the third electrically conductive contact substantially fills the indentation in the second layer of the undoped second polar Group III nitride material.

A number of other embodiments of the Group III nitride semiconductor device of these teachings are also disclosed.

In one or more embodiments, the method for fabricating a Group III nitride semiconductor device of these teachings includes depositing a first layer of a first polar undoped Group III nitride material on an undoped substrate, and epitaxially growing a second layer of an undoped second polar Group III nitride material on the first layer of the first polar undoped Group III nitride material, depositing a layer of p doped third polar Group III nitride material disposed on the second layer of the undoped second polar Group III nitride material, depositing a first and second electrically conductive contacts disposed at predetermined positions over portions of the layer of p-doped third polar Group III nitride material, a 2D hole gas being formed at a heterojunction between the first layer of the first polar undoped Group III nitride material and the second layer of the undoped second polar Group III nitride material, etching away a section of the layer of p doped third polar Group III nitride material, thereby forming a first slab of p-doped third polar Group III nitride material disposed on the second layer of the undoped second polar Group III nitride material and a second slab of p-doped third polar Group III nitride material disposed on the second layer of the undoped second polar Group III nitride material, the second slab of p-doped third polar Group III nitride material being spaced apart from the first slab of p-doped third polar Group III nitride material, and depositing a third electrically conductive contact disposed over the second layer of the undoped second polar Group III nitride material, disposed away from the first and second electrically conductive contacts, and depositing a third electrically conductive contact disposed over the second layer of the undoped second polar Group III nitride material, disposed away from the first and second electrically conductive contacts.

A number of other embodiments of the method for fabricating a Group III nitride semiconductor device of these teachings are also disclosed.

For a better understanding of the present teachings, together with other and further needs thereof, reference is made to the accompanying drawings and detailed description.

BRIEF DESCRIPTION OF THE DRAWINGS

FIGS. 1A-1D show epitaxially grown GaN/AlN heterostructure in one embodiment of these teachings;

FIGS. 2A-2C show structural properties of the MBE-grown GaN/AlN heterostructures in one embodiment of these teachings;

DETAILED DESCRIPTION

Figure 1:
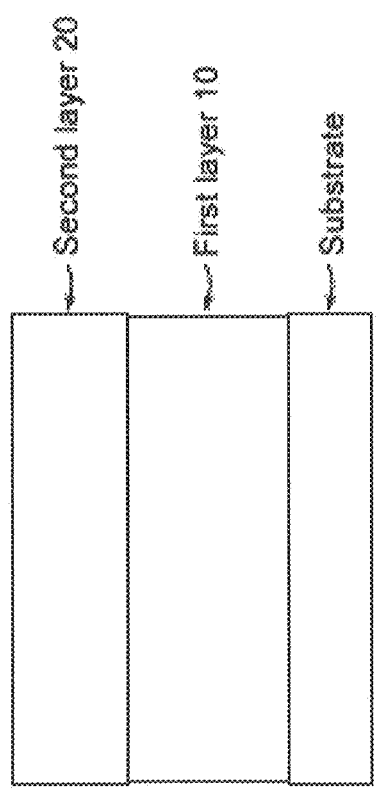
FIG. 1 shows a schematic representation of an epitaxially grown heterostructure of these teachings.

The following detailed description presents the currently contemplated modes of carrying out the invention. The description is not to be taken in a limiting sense, but is made merely for the purpose of illustrating the general principles of the invention, since the scope of the invention is best defined by the claims.

III-Nitride heterostructures with low p-type sheet resistance and III-Nitride heterostructure devices with gate recess and devices including the III-Nitride heterostructures are disclosed hereinbelow.

The III-Nitride heterostructures used herein are the III-Nitride heterostructures disclosed in the publication WO 2020/018895 A1 of PCT application PCT/US2019/042584, filed on Jul. 19, 2019, and which claims priority of U.S. provisional application No. 62/701,219, entitled POLARIZATION-INDUCED 2D HOLE GASES FOR HIGH-VOLTAGE P-CHANNEL TRANSISTORS, and filed on Jul. 20, 2018, both of which are incorporated by reference herein in their entirety and for all purposes.

Group III, as used herein, refers to CAS Group IIIA (Triels or the Boron group) in the periodic table.

Group II, as used herein, refers to CAS Group IIB (the zinc family) in the periodic table.

III-nitride semiconductor materials, as used herein, refers to (Al, In, Ga and their alloys) N.

Oxide semiconductor materials, as used here in, refers to Group II or Group III oxides, such as ZnO or $Ga_2O_3$. The total macroscopic polarization P of a Group III nitride layer or Group II or Group III oxide layer, in the absence of external electric fields, as used herein, is the sum of the spontaneous polarization $P_{SP}$ in the equilibrium lattice, and the strain-induced or piezoelectric polarization $P_{PE}$. (See, for more details, O. Ambacher et al., Two-dimensional electron gases induced by spontaneous and piezoelectric polarization charges in N- and Ga-face AlGaN/GaN heterostructures. *J. Appl. Phys.* 85, 3222-3233 (1999), which is Incorporated by reference here in in its entirety and for all purposes.)

"Noncentrosymmetric compound crystals exhibit two different sequences of the atomic layering in the two opposing directions parallel to certain crystallographic axes, and consequently crystallographic polarity along these axes can be observed. For binary A-B compounds with wurtzite structure, the sequence of the atomic layers of the constituents A and B is reversed along the [0001] and [000$\bar{1}$] directions" (See, for more details, O. Ambacher et al., Two-dimensional electron gases induced by spontaneous and piezoelectric polarization charges in N- and Ga-face AlGaN/GaN heterostructures. *J. Appl. Phys.* 85, 3222-3233 (1999)).

"Polar," as used herein, refers to onr of those two crystallographic polarities. It should be noted that both Group III nitrides and oxide semiconductors are A-B compounds and will both exhibit two crystallographic polarities.

Metal polar, as used herein, refers to the crystallographic polarity along the axis of a Group III N compound with wurtzite structure. (See, for more details, O. Ambacher et al., Two-dimensional electron gases induced by spontaneous and piezoelectric polarization charges in N- and Ga-face AlGaN/GaN heterostructures. *J. Appl. Phys.* 85, 3222-3233 (1999), pp. 3224-3225.)

N polar, as used herein, refers to the crystallographic polarity along the [000$\bar{1}$] axis of a Group III N compound with wurtzite structure.

Undoped, as used herein, refers to material for which there have been no active or intentional doping.

An energy bandgap, as used herein, refers to the energy difference (in electron volts) between the top of the valence band and the bottom of the conduction band in insulators and semiconductors.

A 2D charged particle gas (2D hole gas or 2D electron gas) is an ensemble of charged particles of the same charge that is free to move in two dimensions, but tightly confined in the third.

The discovery of p-type doping of the wide-bandgap semiconductor gallium nitride (GaN) around 1990 changed the field of semiconductor physics. It enabled the immediate realization of bright blue light emitting diodes and lasers, and started the solid-state lighting revolution, which today has transformed the lives of a large fraction of the population of the planet. To make energy-efficient visible lighting successful, it is necessary to inject both electrons and holes from supply layers in GaN into InGaN quantum wells, where they recombine and produce photons of desired wavelengths. This requires the complementary n-type doping of GaN too, which was fortunately available for several decades before the discovery of p-type doping. While holes are generated by substitution of Ga atoms in the GaN crystal by Mg acceptor atoms, n-type doping is achieved by replacing Ga by Si or Ge donor atoms.

The p-type analog of the undoped polarization-induced 2D electron gas—the undoped 2D hole gas has, however, remained elusive till these teachings. Although low density 2D hole gases have been previously inferred in nitride heterojunctions such as in GaN/AlGaN/GaN, GaN/InGaN/GaN, GaN/AlInGaN/GaN GaN/AlGaN, and GaN/AlN, these structures have been either p-type modulation doped heterostructures, or structures that have both electron and hole gases present. The missing dual piece of the undoped 2D hole gas has held back the widespread use of GaN for complementary logic electronics for digital applications till today, just like the absence of bulk p-doping had held back high efficiency photonic devices till the 90s. Significant advances in energy-efficient electronics can be enabled by GaN based high-voltage complementary low loss switches exploiting the large bandgap of the semiconductor, if a high conductivity undoped 2D hole gas can be found.

In these teachings, a Group III nitride semiconductor device having a first layer of a first polar undoped Group III nitride material or a or Group II or Group III oxide material (10, FIG. 1) is grown on an undoped substrate and a second layer of an undoped second polar Group III nitride material (20, FIG. 1) or Group II or Group III oxide material, epitaxially grown on the first layer of the first polar undoped Group III nitride material or Group II or Group III oxide material. For some crystal structures and choice of materials, a difference between the normal component of the polarization of the second layer of the undoped second polar Group III nitride material or Group II or Group III oxide material and the first layer of the first polar undoped Group III nitride material or Group II or Group III oxide material is negative. For the same crystal structure and choice of materials, there is there is an energy band offset between valence bands of the first polar undoped Group III nitride material or Group II or Group III oxide material and the undoped second polar Group III nitride material or Group II or Group III oxide material. Under those conditions, holes are confined in the direction perpendicular to the heterojunction between the first layer of the first polar undoped Group III nitride material or Group II or Group III oxide material 10 and the second layer of the undoped second polar Group III nitride material or Group II or Group III oxide material 20 but can move freely in directions part to the heterojunction, thereby forming a 2D hole gas at the heterojunction. A 2D electron gas is not present. In the embodiment shown in FIG. 1, the first layer of the first polar undoped Group III nitride material or Group II or Group III oxide material is deposited on an undoped substrate.

Embodiments in which the first polar undoped Group III nitride material is undoped polar AlN and the second polar Group III nitride material is undoped polar GaN, the first polar undoped Group III nitride material is undoped polar AlN and the second polar Group III nitride material is one of undoped polar $In_xGa_{1-x}N$ or $Al_xGa_{1-x}N$ where x is a number less than 1 and greater than 0 (including any combination), wherein the first polar undoped Group III nitride material is undoped 1 polar $Al_xGa_{1-x}N$ and the second polar Group III nitride material is one of undoped polar GaN or $In_xGa_{1-x}N$ where x is a number less than 1 and greater than 0, or wherein the first polar undoped Group III nitride material is undoped polar $Al_xIn_yGa_{(1-(x+y))}N$ where x and y are numbers less than 1 and greater than 0, the sum of x and y being less than 1, and the second 1 polar Group III nitride material is undoped polar GaN are within the scope of these teachings.

These teachings include embodiments in which a polarity of semiconductor materials in the structure is metal polar and embodiments in which a polarity of semiconductor materials is N polar.

Embodiments in which the first polar undoped Group II oxide material is undoped polar ZnO and the second polar Group II oxide material is undoped polar $Zn_xMg_{1-x}O$ where x is a number less than 1 and greater than 0, or in which the first polar undoped Group III oxide material is undoped polar $Ga_2O_3$ and the second polar Group III oxide material is one of undoped polar $(Al_xGa_{1-x})_2O_3$ where x is a number less than 1 and greater than 0, are within the scope of these teachings. Embodiments in which the polarity of the semiconductor materials is metal polar and embodiments in which the polarity of semiconductor materials is O polar are within the scope of these teachings.

Embodiments with multiple Group III polar nitride material interfaces as above forming multiple 2D hole gas channels with necessary compensation doping necessary to prevent the formation of 2D electron channels—no mobile electrons are present, are within the scope of these teachings.

Embodiments in which the undoped substrate is one of Sapphire, c-plane Sapphire, undoped bulk single crystal AlN, undoped bulk single crystal polar AlN, silicon carbide, Si-face silicon carbide or silicon are within the scope of these teachings.

These teachings provide:
Completely undoped wide bandgap semiconductor heterostructures
High p-type conductivity
Wide bandgap for high voltage p-channel transistor
Can be fabricated by MOCVD and MBE, both industrially used techniques In another embodiment, the Group III nitride semiconductor device also includes a layer of p doped second polar Group III nitride material disposed on the second layer of the undoped second polar Group III nitride material. The layer of p doped second polar Group III nitride material disposed on the second layer of the undoped second polar Group III nitride material can be, in one instance, formed by doping an upper portion of the second layer 25 of the undoped second polar Group III nitride material. Embodiments of heterostructures of wide bandgap oxide semiconductor materials, including Group II or Group III oxides, such as ZnO or $Ga_2O_3$, are within the scope of these teachings. Embodiments in both crystallographic polarities are also within the scope of these teachings.

In order to further elucidate these teachings, an exemplary embodiment is presented herein below. It should be noted that these teachings are not limited only to the exemplary embodiment. In the exemplary embodiment, the first metal polar undoped Group III nitride material 10 is undoped metal polar AlN and the second metal polar Group III nitride material 20 is metal polar GaN.

GaN and AlN in the wurtzite crystal structure have a broken inversion symmetry along the 0001 axis or the c-direction, leading to the existence of spontaneous polarization $P_{sp}^{GaN}$ and $P_{sp}^{AlN}$ in them. This implies the existence of two distinct polarities: metal-polar structures are considered in this embodiment. Because AlN has a smaller lattice constant than GaN, a thin epitaxial layer of AlN grown on top of a relaxed GaN layer is compressively strained, leading to a piezoelectric polarization $P_{sp}^{AlN}$. The spontaneous and piezoelectric polarization fields add in the AlN layer, and the difference across the AlN/GaN heterojunction, $$[(P_{sp}^{AlN}+P_{pz}^{AlN})-P_{sp}^{GaN}]\cdot\hat{n}=\sigma_\pi$$

is the net fixed polarization sheet charge density formed at the heterojunction. If the crystal is oriented in the metal-polar direction, this fixed polarization sheet charge is positive in sign. Combining this polarization charge and the resulting electric field, with the electron potential energy barrier provided by the large energy band offset $E_C^{AlN}-E_C^{GaN}=\Delta E_C$ between the conduction band edges of AlN and GaN, induces the formation of the quantum-confined 2D electron gas at such a heterojunction. The densities that can be induced by the polar discontinuity are limited only by the polarization sheet charge $\sigma_\pi$, and far exceed those achieved by modulation doping or Mott criteria, and do not cause ionized impurity scattering. Such robust polarization induced 2DEGs in Al(Ga)N/GaN heterojunctions have been investigated for the last two decades and contributed to several applications such as ultrafast unipolar transistors and sensors.

If on the other hand, a thin layer of GaN is grown epitaxially on a relaxed AlN substrate, the GaN layer is under tensile strain. For the metal-polar orientation, the polarization difference $$[(P_{sp}^{GaN}+P_{pz}^{GaN})-P_{sp}^{AlN}]\cdot\hat{n}=\sigma_\pi$$

is negative in sign. This negative immobile interface polarization charge should induce positively charged mobile carriers, or holes. The energy band-offset between the valence bands of AlN and GaN, $E_V^{AlN}-E_V^{GaN}=\Delta E_V$ provides the necessary barrier for quantum-confining the holes to 2D. This is schematically shown in the energy band diagram shown in FIG. 1(a), which is a self-consistent solution of a multiband k.p and Scrodinger and Poisson equations for the GaN/AlN heterostructure (see S. Birner, T. Zibold, T. Andlauer, T. Kubis, M. Sabathil, A. Trellakis, P. Vogl, nextnano: General purpose 3-D simulations. *IEEE Trans. Electron Devices.* 54, 2137-2142 (2007)). A mobile 2D hole gas of sheet density close to the fixed interface polarization charge $\rho_\pi\sim4\times10^{13}/cm^2$ is expected to form at the heterojunction, depending on the thickness of the GaN layer. The holes are formed due to the field-ionization (or quantum tunneling) of electrons out of the valence band states into empty, localized surface states.

FIG. 1B shows the layer structures that were grown for this exemplary embodiment. A metal-polar AlN surface on a c-plane sapphire crystal was used as the substrate. An GaN/AlN layer was grown on it by molecular beam epitaxy (MBE). FIG. 1C shows a zoomed in lattice image of the crystal heterointerface. A sharp heterojunction is observed, across which GaN and AlN are in the wurtzite crystal structure, and the GaN layer is coherently strained to the AlN layer. Further structural and chemical details of the heterojunction are shown in FIGS. 2A-2C. FIG. 2A shows a smooth surface morphology of the as-grown surface, with rms roughness less than 1 nm in a 10 um×10 um scan area, and clearly resolved atomic steps. FIG. 2B shows the X-ray diffraction spectrum of the heterojunction. The fringes and multiple peaks indicate a smooth few nm thick layer over the entire photon beam size of mms. This is further corroborated by the large width TEM images in the supplementary section FIGS. 6A, 6B. FIG. 2C is the reciprocal-space X-ray map, which proves that the GaN epitaxial layer is coherently strained to the underlying AlN layer, with an extracted biaxial compressive strain of 2.4%. The strain state determines the net piezoelectric polarization charge in the heterostructure. FIGS. 1A-1D and 2A-2C thus collectively show that the heterostructure is structurally and chemically in a form that should exhibit the undoped polarization-induced 2D hole gas, but it is necessary to have control samples to be certain.

Figures 3A, 3B, 3C:
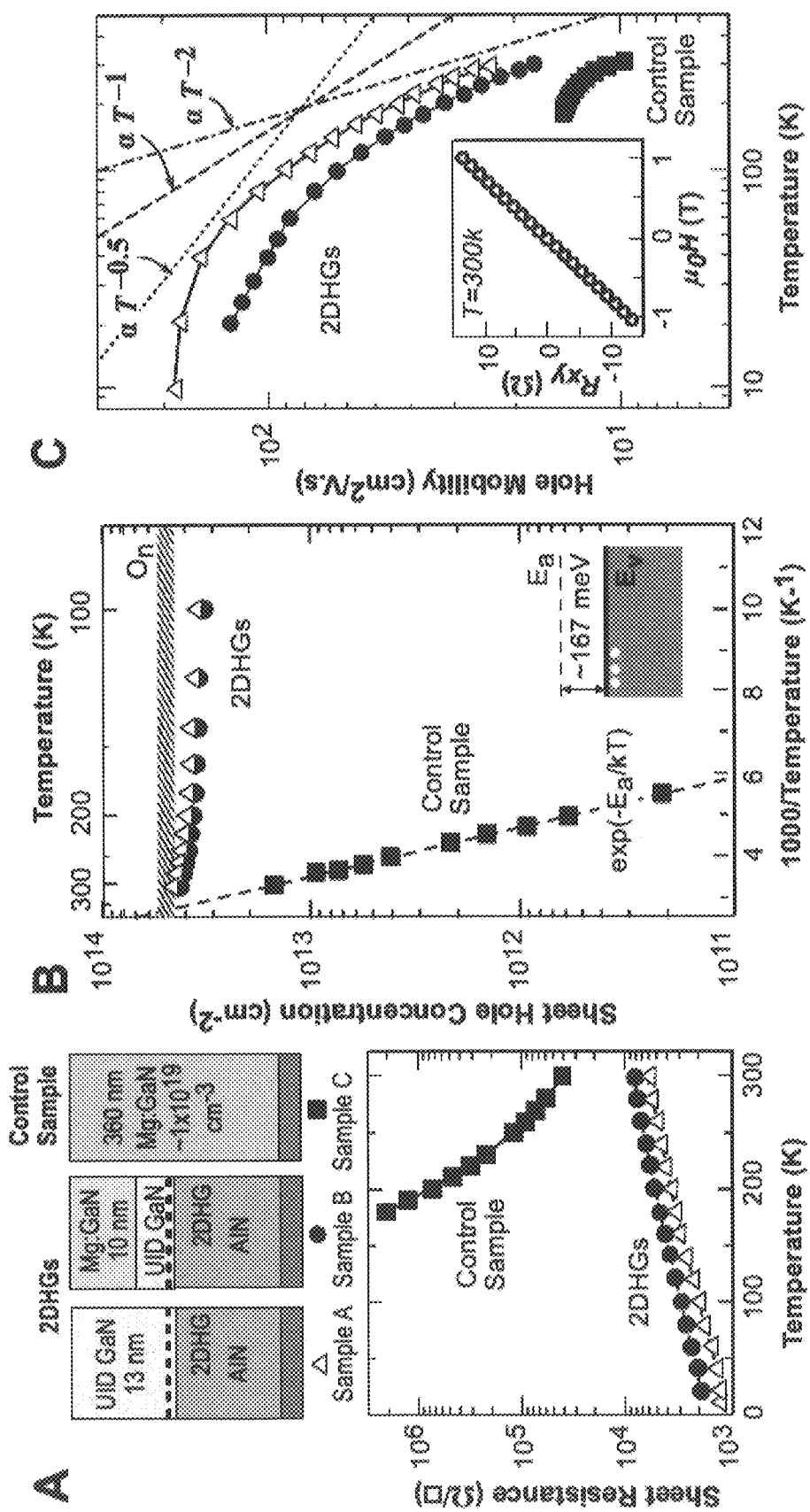
FIGS. 3A-3C show results of temperature-dependent Hall-effect measurements from 300K to 20K at 1 T magnetic field of 2DHG embodiments A, B, along with Sample C: a p-type doped GaN control sample.

FIG. 3A shows the layer structure of three samples: Sample A is an undoped ~13 nm GaN layer on AlN. Sample B is identical to A, except the top 10 nm of GaN are doped with Mg to lock the Fermi level to valence band edge separation, thereby screening the 2DHG from variations of the surface potential. For comparison with conventional acceptor doping, a thick Mg-doped GaN (sample C) was also measured. FIGS. 3, A-C show the temperature-dependent Hall-effect transport properties of the three samples measured from 300 K-10 K. The mobile charge density $n_s=IB/qV_F$ is obtained from the Hall voltage $V_H$ that develops upon driving a current I through the 2D hole gas in a magnetic field B perpendicular to its plane. The Hall voltage results from the Lorentz force $F=q(v\times B)$ which drives holes in a direction opposite to electrons, leading to a positive sign. The carrier mobility $\mu_p=1/qn_sR_s$, is obtained from the measured sheet resistance $R_s$. The positive slope of the Hall resistance ($V_H/I$) versus magnetic field, and positive Hall-coefficient sign for all samples in these teachings ensures that only holes are being studied and compared.

The resistivity of the Mg-doped bulk GaN control sample C increases sharply with the lowering of temperature, from ~40 kΩ/sq at 300 K to 2 MΩ/sq at ~180 K (FIG. 3A). FIG. 3B shows that this increase in resistivity is almost entirely caused by the ~100× decrease of the thermally generated mobile hole density, which freezes out with an activation energy $E_A\sim170$ meV. A dramatically different behavior is observed for the undoped heterostructure sample A, and the Mg-doped heterostructure B. They show metallic behavior, with the resistivity decreasing with decreasing temperature, a signature of a degenerate 2D hole gas.

From the above disclosure, p-channel high voltage transistors can be arrived at. FIGS. 4A-4E show a number of embodiments of p-channel Group III nitride semiconductor device of these teachings. Referring to FIGS. 4A-4E, the Group III nitride semiconductor device of these teachings shown there in includes a first layer of a first polar undoped Group III nitride material 15 grown on an undoped substrate material, a second layer of an undoped second polar Group III nitride material 25 epitaxially grown on the first layer of the first polar undoped Group III nitride material, wherein a difference between a normal component of a polarization of the second layer of the undoped second polar Group III nitride material and the first layer of the first polar undoped Group III nitride material is negative, and wherein there is an energy band offset between valence bands of the first polar undoped Group III nitride material and the undoped second polar Group III nitride material, an energy bandgap of the undoped second polar Group III nitride material being smaller than an energy bandgap of the first polar undoped Group III nitride material, a 2D hole gas at a heterojunction between the first layer of the first polar undoped Group III nitride material 15 and the second layer of the undoped second polar Group III nitride material 25. A first slab of p-doped third polar Group III nitride material, 30 is disposed on the second layer of the undoped second polar Group III nitride material 25, and a second slab of p-doped third polar Group III nitride material 40 is also disposed on the second layer of the undoped second polar Group III nitride material 25. The second slab of p-doped third polar Group III nitride material 40 is spaced apart from the first slab of p-doped third polar Group III nitride material 30. A first electrically conductive contact 50 is disposed over a portion of the first slab of p-doped third polar Group III nitride material, 30. A second electrically conductive contact 60 is disposed over a portion of the second slab of p-doped third polar Group III nitride material 40. A third electrically conductive contact A/D is disposed over a surface of the second layer of the undoped second polar Group III nitride material 20, the surface being located between the first slab of p-doped third polar Group III nitride material 30 and the second slab of p-doped third polar Group III nitride material 40 and opposite a surface of the first layer of the first polar undoped Group III nitride material 15 on which the second layer of the undoped second polar Group III nitride material 25 is grown. The third electrically conductive contact being disposed away from the first and second electrically conductive contacts 50 and 60. In the embodiment shown in FIG. 4A, the third electrically conductive contact 80 is disposed away from the first slab of p-doped third polar Group III nitride material 30 and the second slab of p-doped third polar Group III nitride material.

Figure 4A:
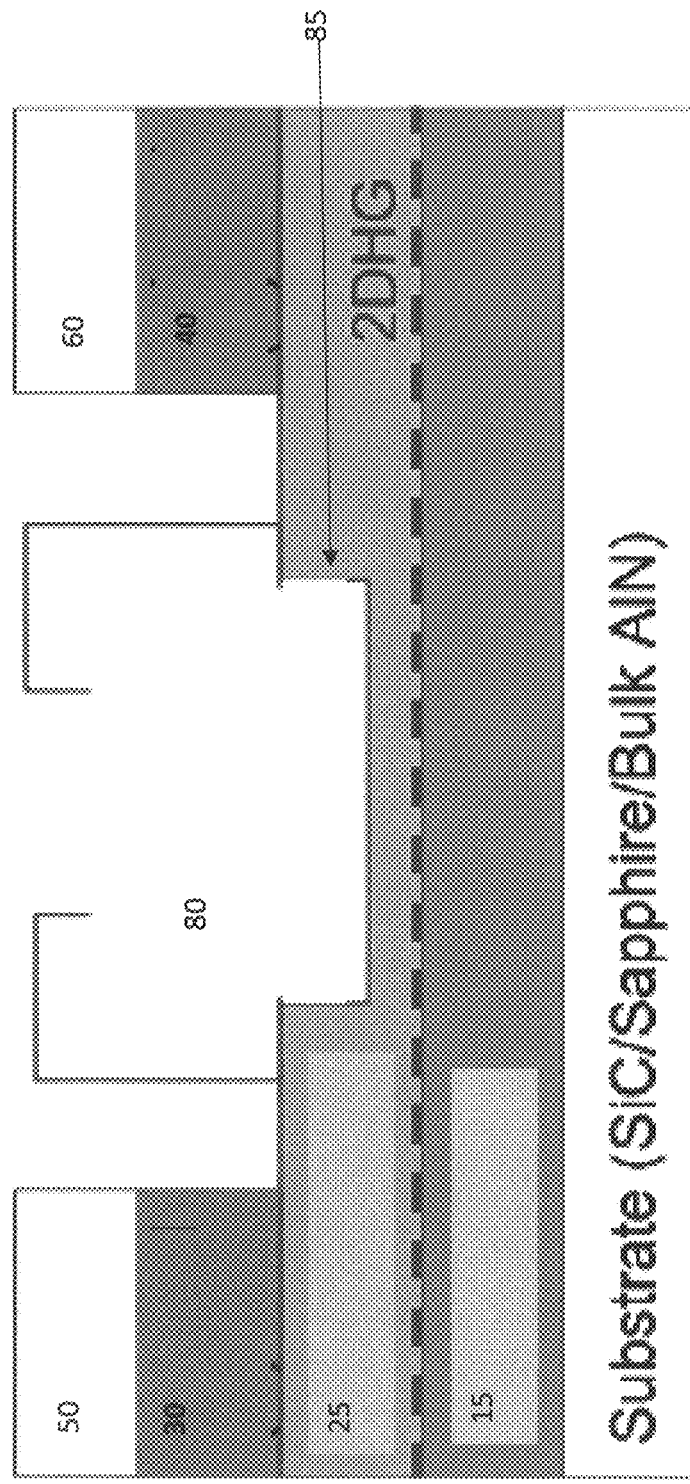
FIGS. 4A-4H show embodiments of the Group III nitride semiconductor device of these teachings.
Figure 4B:
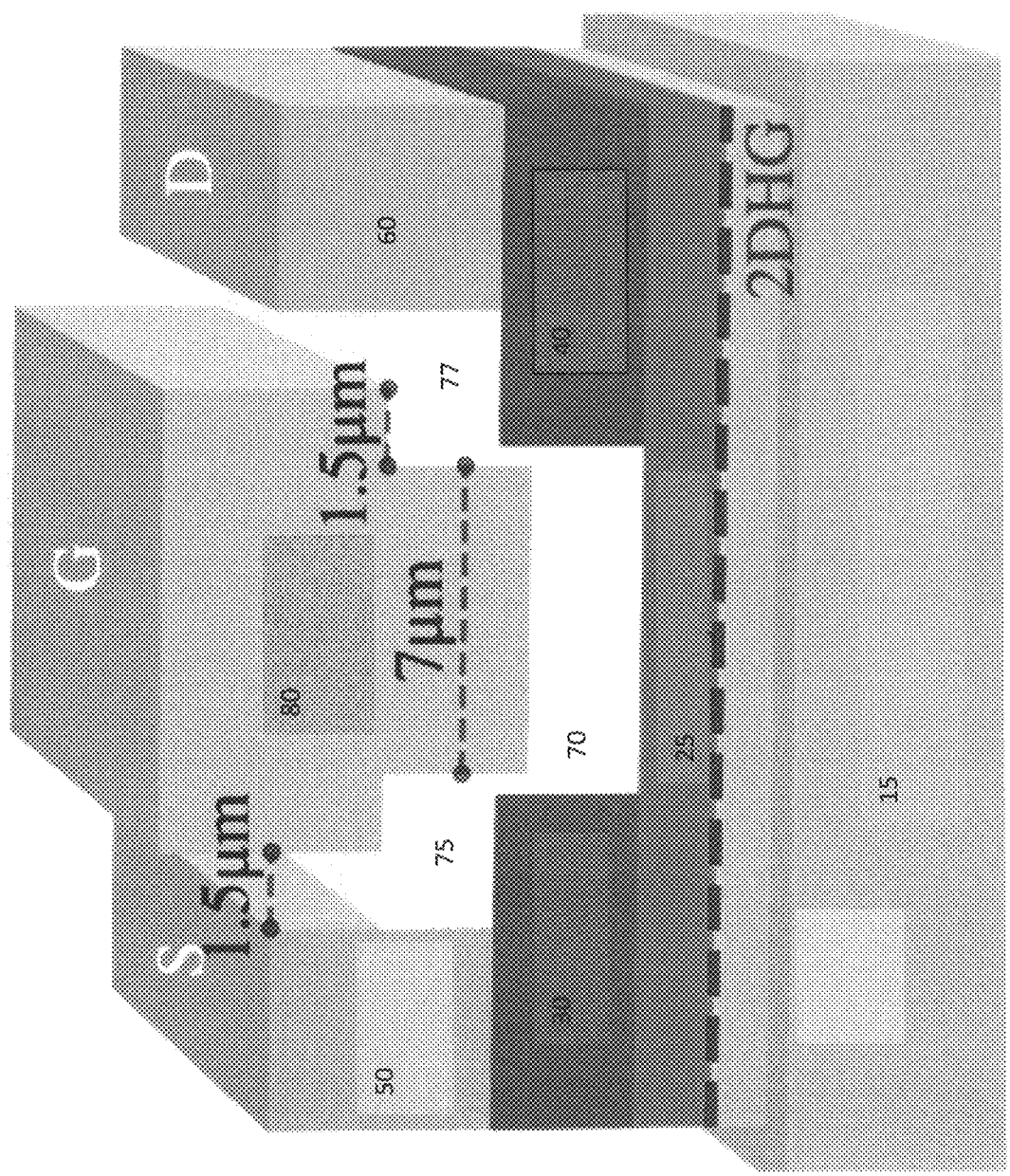

In the embodiment shown in FIG. 4B, the Group III nitride semiconductor device shown there in also includes an insulating layer 70, 75, 77 disposed on a section of each one of first slab of p-doped third polar Group III nitride material, 30 and the second slab of p-doped third polar Group III nitride material 40 that is not covered by the first electrically conductive contact 50 and the second electrically conductive contact 60. The insulating layer 70 is also disposed on a sidewall of the first slab of p-doped third polar Group III nitride material 30 and an opposing sidewall of the second slab of p-doped third polar Group III nitride material 40, and disposed on the surface of the second layer of the undoped second polar Group III nitride material 20, the surface being located between the first slab of p-doped third polar Group III nitride material, 30 and the second slab of p-doped third polar Group III nitride material 40. The third electrically conductive contact 80 is disposed over the insulating layer 70. The third electrically conductive contact is disposed away from the first and second electrically conductive contacts 50, 60.

Referring to FIG. 4A, in the embodiment shown there in, the second layer of the undoped second polar Group III nitride material has an indentation 85 extending from a first surface on which the first slab of p-doped third polar Group III nitride material 30 and the second slab of p-doped third polar Group III nitride material 40 are disposed to a second surface disposed between the first surface and a surface in contact with the first layer of a first polar undoped Group III nitride material 15. The indentation 85 is disposed between the first and second slabs of p-doped second polar Group III nitride material 30, 40. The third electrically conductive contact 80 substantially fills the indentation 85 in the second layer of the undoped second polar Group III nitride material 25. In the instance shown in FIG. 4A, the third electrically conductive contact 80 is disposed away from the first slab of p-doped third polar Group III nitride material 30 and the second slab of p-doped third polar Group III nitride material 40.

Figure 4C:
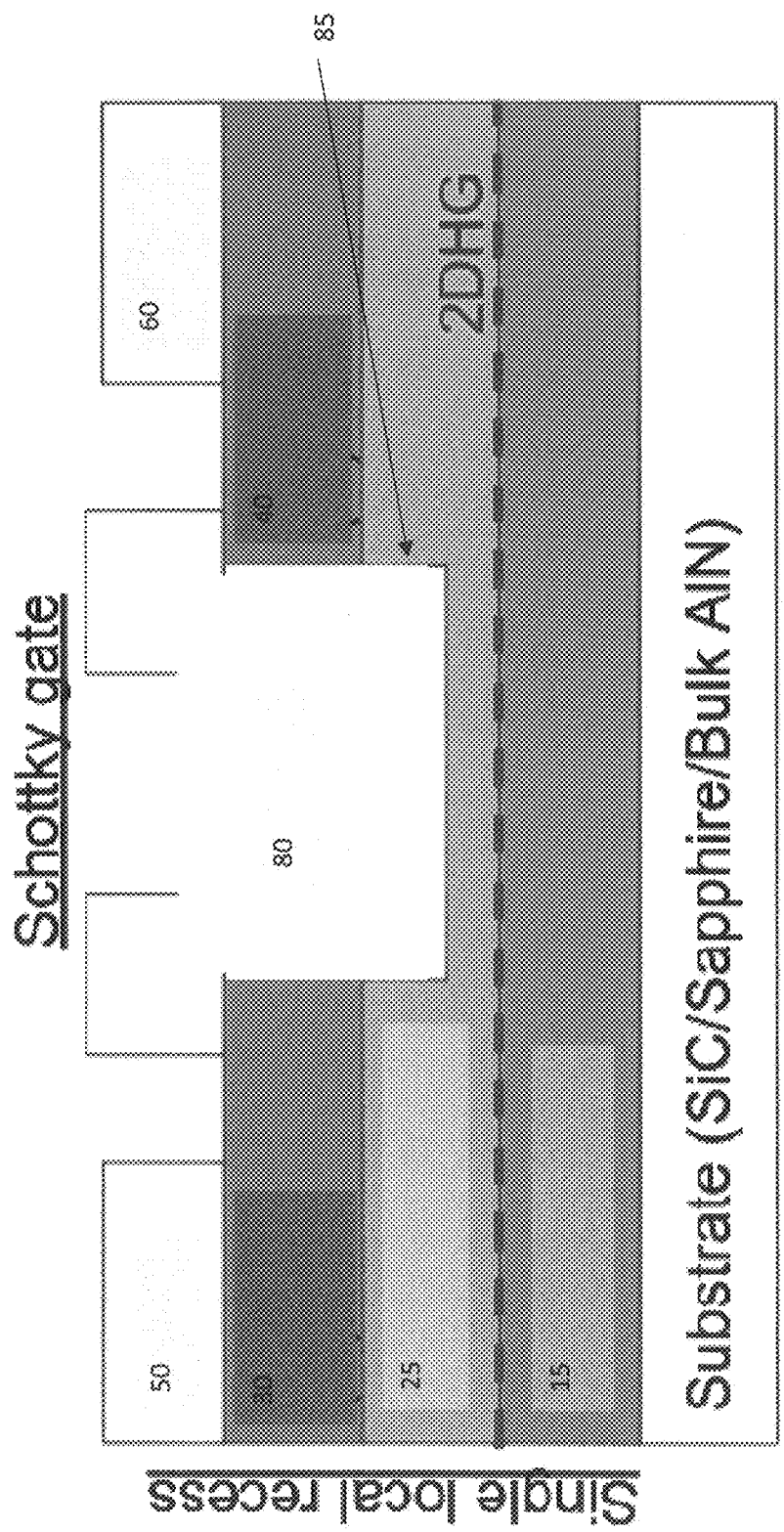

In the embodiment shown in FIG. 4C, the third electrically conductive contact 80 is disposed in proximity with the first slab of p-doped third polar Group III nitride material 30 and the second slab of p-doped third polar Group III nitride material 40.

Figure 4D:
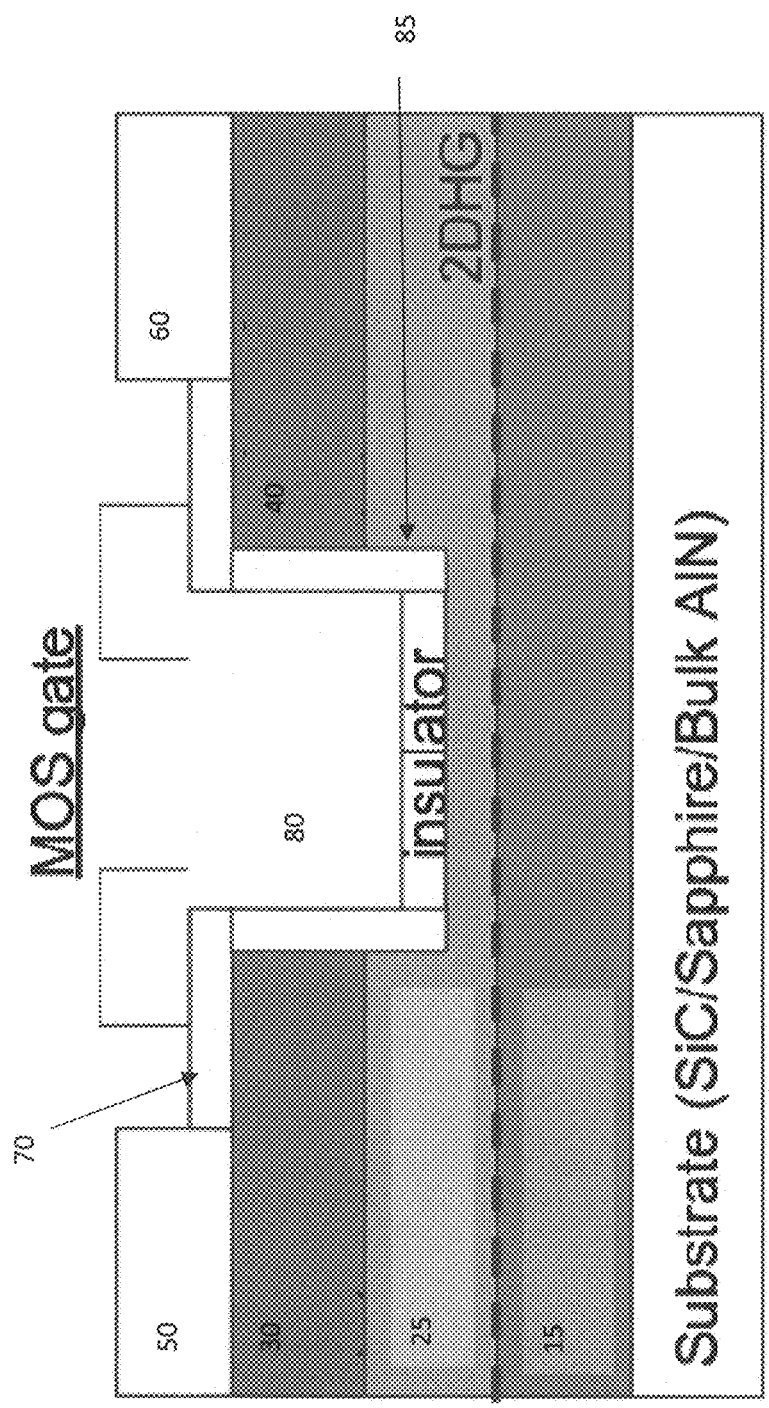

In the embodiment shown in FIG. 4D, there is also an indentation 85 in the second layer of the undoped second polar group III nitride material 25 and the semiconductor device also has an insulating layer disposed on a section of each one of first slab of p-doped third polar Group III nitride material 30 and the second slab of p-doped third polar Group III nitride material 40 that is not covered by the first electrically conductive contact 50 and the second electrically conductive contact 60. The insulating layer 70 is also disposed on a sidewall of the first slab of p-doped third polar Group III nitride material there and an opposing sidewall of the second slab of p-doped third polar Group III nitride material 40, and disposed on a surface of the indentation 85. The third electrically conductive contact 80 is disposed over the insulating layer 70. The third electrically conductive contact 80 it is also disposed away from the first and second electrically conductive contacts 50, 60.

Figure 4E:
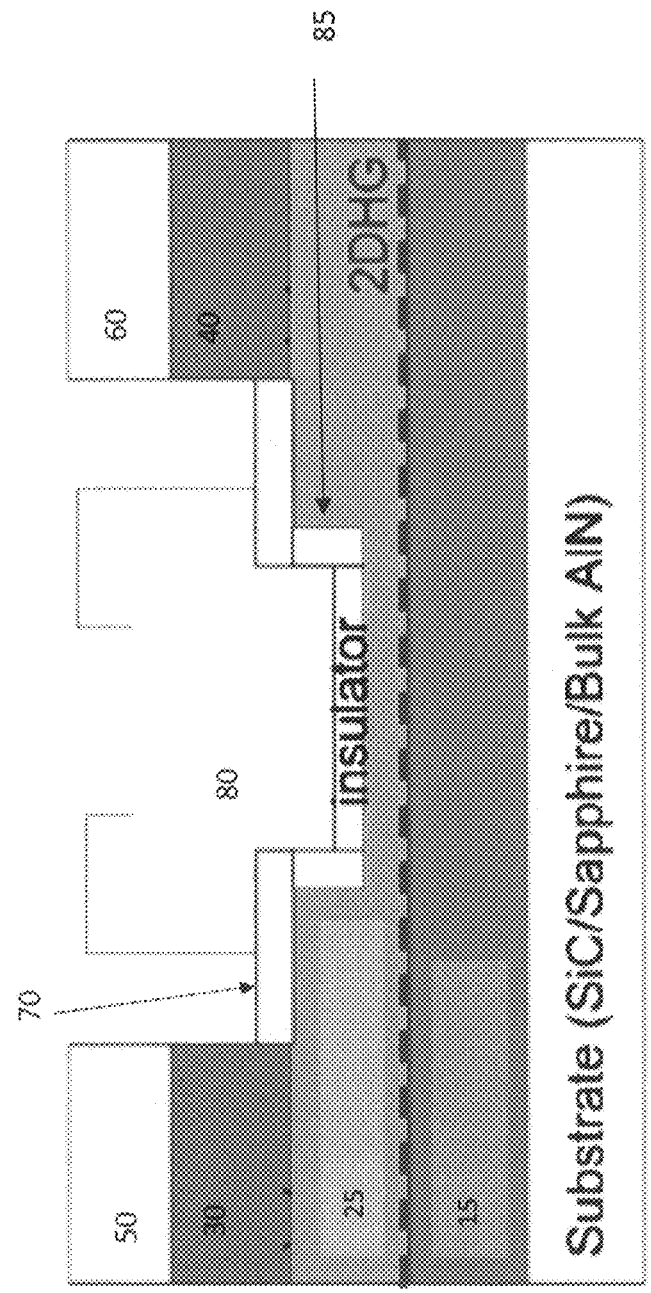

In the embodiment shown in FIG. 4E, there is also an indentation 85 in the second layer of the undoped second polar group III nitride material 25. The semiconductor device also has an insulating layer 70 disposed on a section of a first surface of the second layer of the undoped second polar Group III nitride material 25 on which the second layer of the undoped second polar Group III nitride material is not covered by the first slab of p-doped third polar Group III nitride material 30 and the second slab of p-doped third polar Group III nitride material 40. The insulating layer 70 is also disposed on opposing sidewalls of the indentation in the second layer of the undoped second polar Group III nitride material 25, and disposed on other surfaces of the indentation 85. The third electrically conductive contact 80 is disposed over the insulating layer 70. The third electrically conductive contact 80 is disposed away from the first and second electrically conductive contacts 50, 60.

Figure 4F:
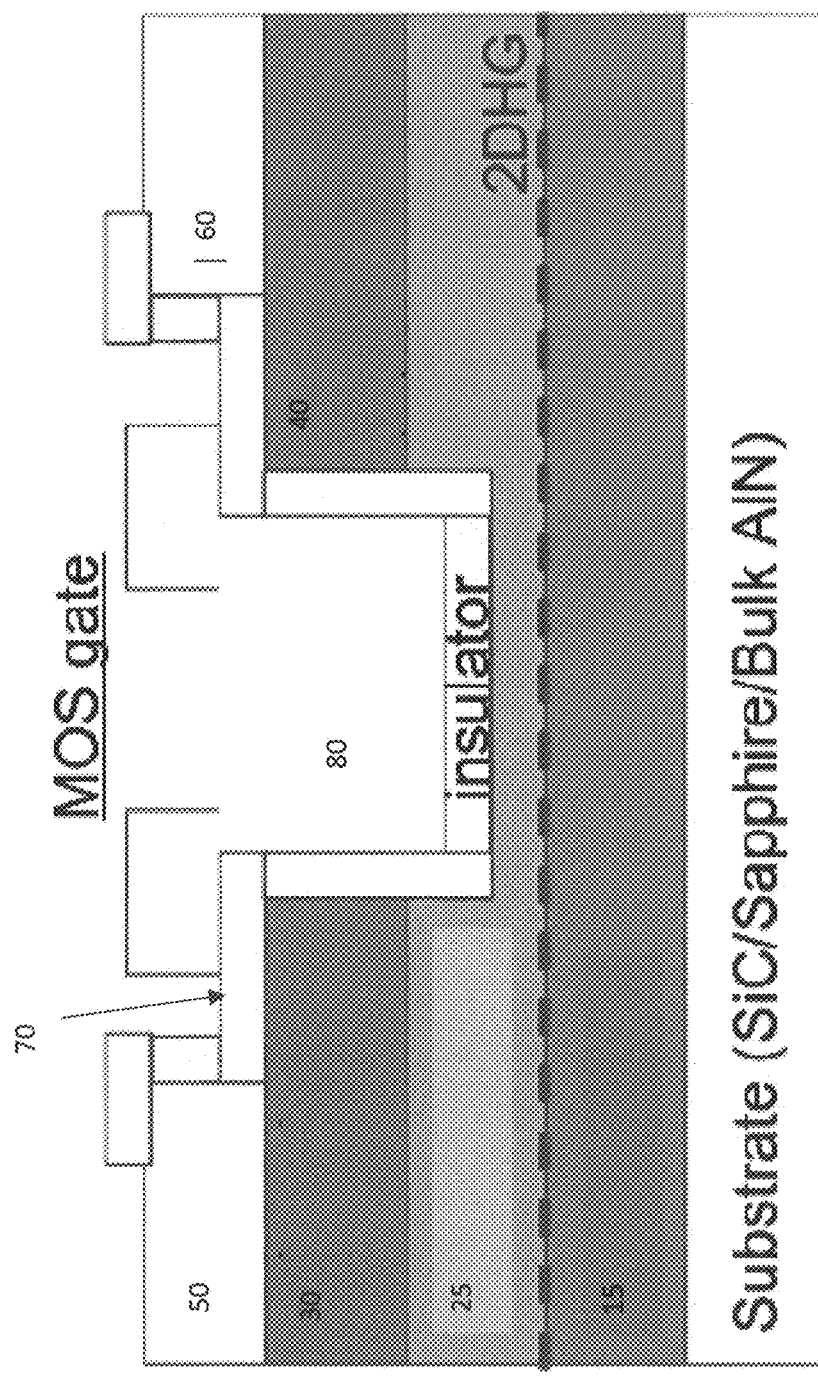

FIG. 4F shows an embodiment similar to that shown in FIG. 4D except that the insulating layer 70 is also disposed over a sidewall of the first electrically conductive contact 50 that is opposite a sidewall of the second electrically conductive contact 60, over a portion of a surface of the first electrically conductive contact 50 that is opposite a surface disposed on the first slab of p-doped third polar Group III nitride material 30; the portion extending from the sidewall of the first electrically conductive contact 50 that is opposite a sidewall of the second electrically conductive contact 60, over the sidewall of the second electrically conductive contact 60 that is opposite the sidewall of the first electrically conductive contact 50, and over a portion of a surface of the second electrically conductive contact 60 that is opposite a surface disposed on the second slab of p-doped third polar Group III nitride material 40; the portion extending from the sidewall of the second electrically conductive contact 60 that is opposite a sidewall of the first electrically conductive contact 50, and, the third electrically conductive contact 80 is disposed over at least a portion of the insulating layer.

Figure 4G:
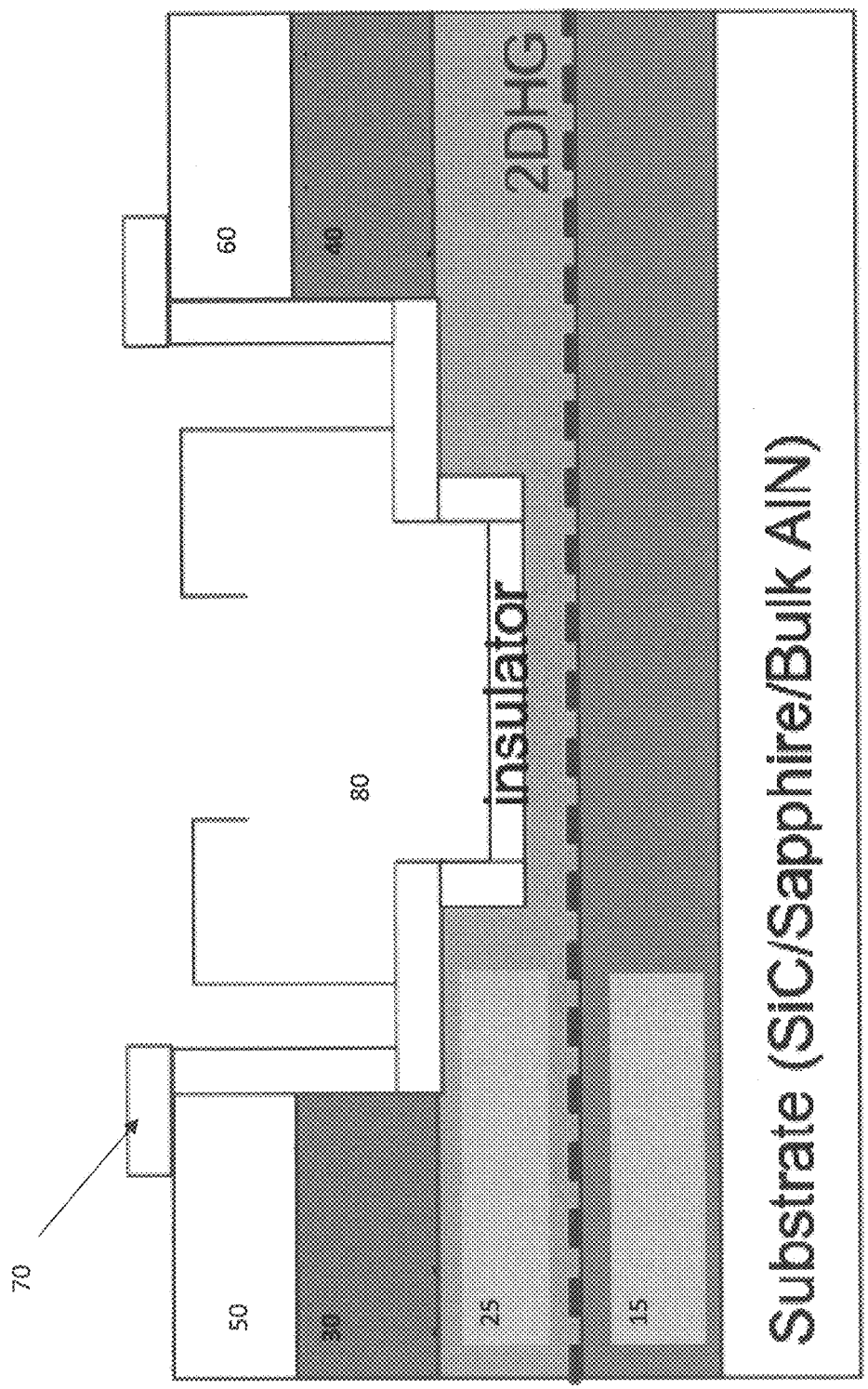
Figure 4H:
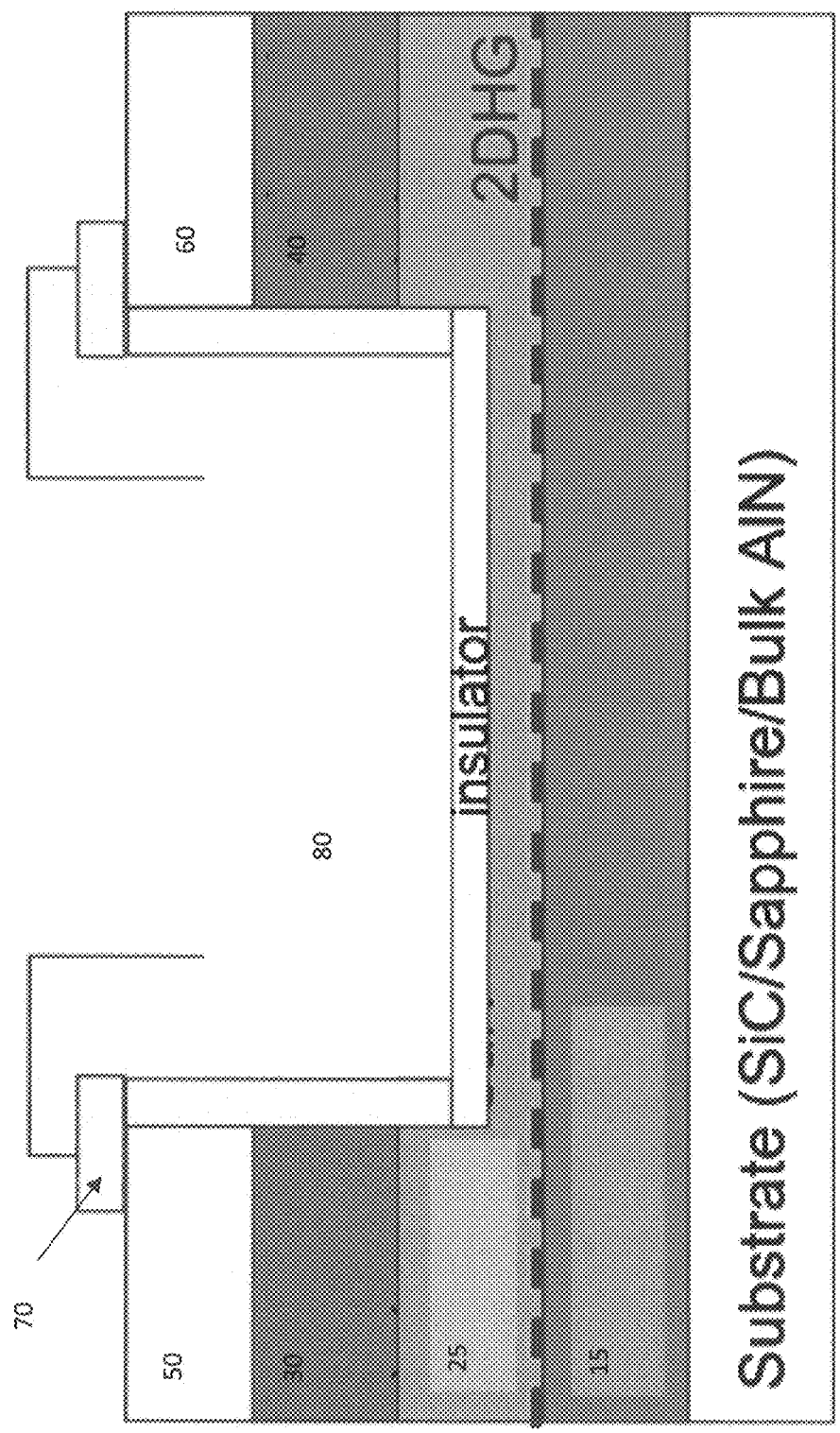

The embodiment shown in FIG. 4H is similar to that shown in FIG. 4F, except that the second slab of p-doped third polar Group III nitride material 40 is completely covered by the second electrically conductive contact 60 and the first slab of p-doped third polar Group III nitride material 30 is completely covered by the first electrically conductive contact 50. In that embodiment, the insulating layer 70. It's also disposed along the sidewall of the first slab of p-doped third polar Group III nitride material 30 that is opposite to a sidewall of the second slab of p-doped third polar Group III nitride material 40 and along the corresponding sidewall of the second slab of p-doped third polar Group III nitride material 40.

The embodiment shown in FIG. 4G is similar to that shown in FIG. 4E, except that the insulating layer 70 is also disposed over a sidewall of first slab of p-doped third polar Group III nitride material 30 that is opposite a sidewall of the second slab of p-doped third polar Group III nitride material 40, over a sidewall of the first electrically conductive contact 50 that is opposite a sidewall of the second electrically conductive contact 60, over a portion of a surface of the first electrically conductive contact 50 that is opposite a surface disposed on the first slab of p-doped third polar Group III nitride material 30, the portion extending from the sidewall of the first electrically conductive contact 50 that is opposite a sidewall of the second conductive contact, over the corresponding sidewall of the second slab of p-doped third polar Group III nitride material 40, over the corresponding sidewall of the second electrically conductive contact 60, and over a portion of a surface of the second electrically conductive contact 60 that is opposite a surface disposed on the second slab of p-doped third polar Group III nitride material 40, the portion extending from the sidewall of the second electrically conductive contact 60 that is opposite the sidewall of the first conductive contact 50, and the third electrically conductive contact being disposed over at least a portion of the insulating layer 70.

Figure 4I:
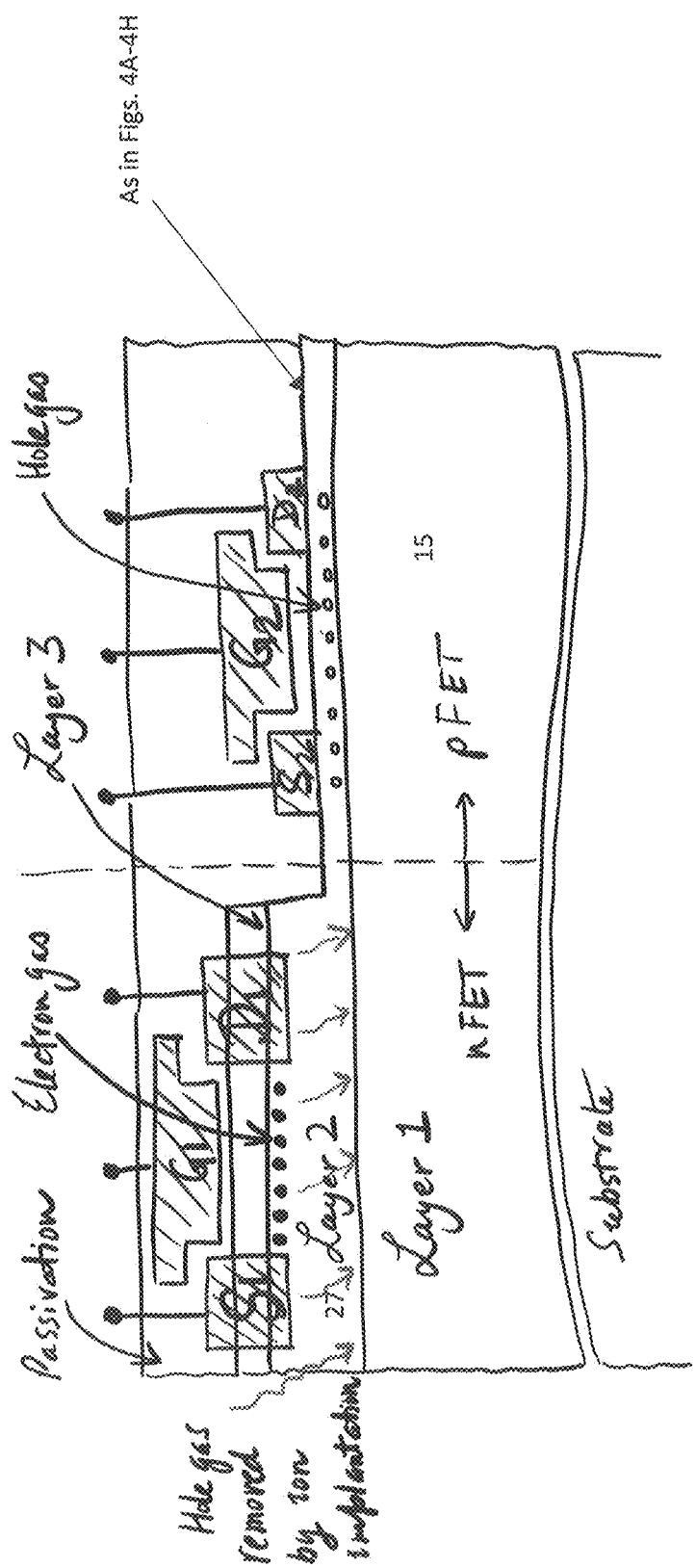
FIG. 4I shows another embodiment of the Group III nitride semiconductor device of these teachings.

There is a need and demand for integrating n-transistors with p-transistors. FIG. 4I shows one embodiment that could allow integration of any of the embodiments in FIGS. 4A to 4H with other semiconductor devices. Referring to FIG. 4I, in the embodiment shown there in, for any of the embodiment shown in FIGS. 4A to 4H, the undoped substrate material, the first layer of a first polar undoped Group III nitride material 15 grown on the undoped substrate material, and the second polar Group III nitride material extend beyond the Group III nitride semiconductor device of these teachings. The extended layers provide a platform for growing at least one other semiconductor device. In one instance, the at least one other semiconductor device is an nFET selected from one of a MOSFET, MESFET, a JFET, or a HEMT. The nFET can includes a 2D electron gas. In some instances, the second polar Group III nitride material is doped or ion implanted, doping or ion implantation selected to prevent formation of 2d Hole gas.

There are some features that are common to all the embodiments, and those figures are identified below.
a. The active region of the device of these teachings is grown on top of of the undoped second polar Group III nitride material buffer which provides a maximal backbarrier and maximum polarization.
b. The active region is all group III nitride materials, which is easier from a reliability standpoint.
c. The gated region contains no dopants, which greatly improves gate efficiency.

In one or more embodiments, the method of these teachings for fabricating a Group III nitride semiconductor device having a 2D hole gas includes depositing a first layer of a first polar undoped Group III nitride material on an undoped substrate, epitaxially growing a second layer of an undoped second polar Group III nitride material on the first layer of the first polar undoped Group III nitride material, wherein a difference between a normal component of a polarization of the second layer of the undoped second polar Group III nitride material and the first layer of the first polar undoped Group III nitride material is negative; and wherein there is an energy band offset between valence bands of the first polar undoped Group III nitride material and the undoped second polar Group III nitride material; an energy bandgap of the undoped second polar Group III nitride material being smaller than an energy bandgap of the first polar undoped Group III nitride material, which results in, a 2D hole gas at a heterojunction between the first layer of the first polar undoped Group III nitride material and the second layer of the undoped second polar Group III nitride material. The method also includes depositing a layer of p doped third polar Group III nitride material disposed on the second layer of the undoped second polar Group III nitride material, depositing a first and second electrically conductive contacts disposed at predetermined positions over portions of the layer of p-doped third polar Group III nitride material, etching away a section of the layer of p doped third polar Group III nitride material, thereby forming a first slab of p-doped third polar Group III nitride material disposed on the second layer of the undoped second polar Group III nitride material and a second slab of p-doped third polar Group III nitride material disposed on the second layer of the undoped second polar Group III nitride material; the second slab of p-doped third polar Group III nitride material being spaced apart from the first slab of p-doped third polar Group III nitride material, and depositing a third electrically conductive contact disposed over the second layer of the undoped second polar Group III nitride material, disposed away from the first and second electrically conductive contacts.

In one or more other embodiment, the method also includes etching away an indentation in the second layer of the undoped second polar Group III nitride material, after etching away the section of the layer of p doped third polar Group III nitride material and before depositing the third electrically conductive contact. The indentation extends from a first surface on which the first slab of p-doped third polar Group III nitride material and the second slab of p-doped third polar Group III nitride material are disposed to a second surface disposed between the first surface and a surface in contact with the first layer of a first polar undoped Group III nitride material, and the indentation is disposed between the first and second slabs of p-doped second polar Group III nitride material.

In embodiments resulting in Schottky gates (such as those in FIGS. 4A and 4C), the third electrically conductive contact substantially fills the indentation in the second layer of the undoped second polar Group III nitride material. In one instance, the third electrically conductive contact is deposited away from the first slab of p-doped third polar Group III nitride material and the second slab of p-doped third polar Group III nitride material. In another instance, the third electrically conductive contact is deposited in contact with (or in proximity to) the first slab of p-doped third polar Group III nitride material and the second slab of p-doped third polar Group III nitride material.

In embodiments resulting in MOS gates (such as those in FIGS. 4B, 4D and 4E), the method also includes depositing an insulating layer before depositing a third electrically conductive contact. In one instance, the insulating layer is disposed on a section of a first surface of the second layer of the undoped second polar Group III nitride material on which the second layer of the undoped second polar Group III nitride material is not covered by the first slab of p-doped third polar Group III nitride material and the second slab of p-doped third polar Group III nitride material, also disposed on opposing sidewalls of the second layer of the undoped second polar Group III nitride material, and also disposed on surfaces of the indentation. In another instance, the insulating layer is disposed on a section of a first surface of the second layer of the undoped second polar Group III nitride material on which the second layer of the undoped second polar Group III nitride material is not covered by the first slab of p-doped third polar Group III nitride material and the second slab of p-doped third polar Group III nitride material, also disposed on opposing sidewalls of the second layer of the undoped second polar Group III nitride material, and also disposed on surfaces of the indentation. In both embodiments, the third electrically conductive contact is deposited over the insulating layer, the third electrically conductive contact being disposed away from the first and second electrically conductive contacts.

Some common characteristics of the embodiments of the method of these teachings are presented below
  i. An epitaxial structure similar to that the publication WO 2020/018895 A1 of PCT application PCT/US2019/042584, filed on Jul. 19, 2019, and which claims priority of U.S. provisional application No. 62/701,219, entitled POLARIZATION-INDUCED 2D HOLE GASES FOR HIGH-VOLTAGE P-CHANNEL TRANSISTORS, and filed on Jul. 20, 2018, must be grown (on any substrate). Alternatively a similar structure with additional layers on top (such as containing an electron gas) may be grown and etched away locally.

ii. Ohmic contacts must be formed providing electrically conductive contact to the two-dimensional hole gas.
iii. If there is p-doping (Mg doping) above the channel, that should be locally etched
iv. A dielectric may or may not be deposited.
v. A gate is deposited Applications The device may be used individually, but one benefit will come from producing electron devices on the same platform (by regrowing an electron channel region, if one is included in the heterostructure, leaving it unetched in certain areas). The electron and hole based devices can then be combined so as to form the collection of complementary circuits seen in any digital/analog circuit class.

Potential uses include High-voltage logic, power amplifier drive circuit, digital power amplifiers, local oscillator chains and RF samplers.

EXEMPLARY EMBODIMENTS

Exemplary embodiments are presented herein below. It should be noted that these teachings are not limited to only the exemplary embodiments.

First Exemplary Embodiment

Figures 5A, 5B, 5C:
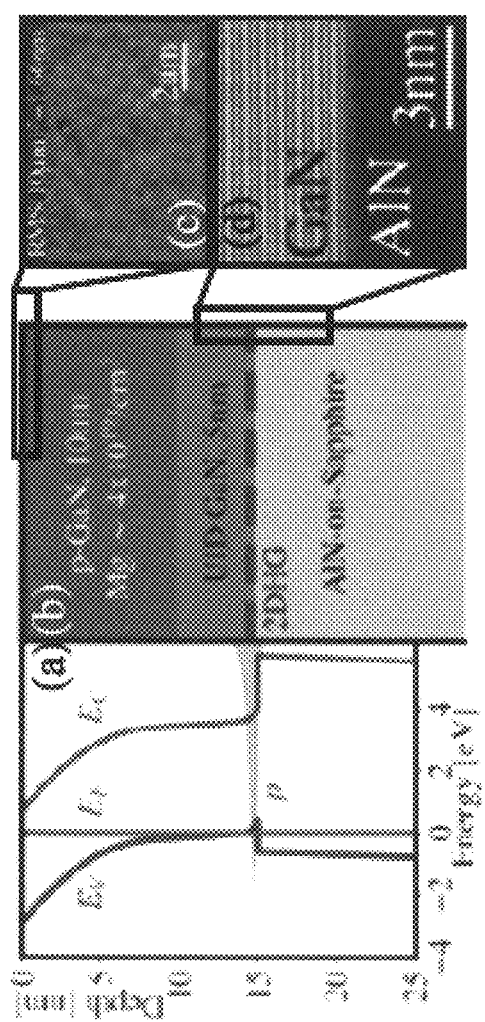
FIGS. 5a-5c are (a) energy-band diagram and (b) layer structure of the grown heterostructure; holes (purple shade) are tightly confined to the GaN/AlN interface, forming a 2D carrier gas. (c) AFM scan, showing a relatively rough (RMS 1.66 nm) epi-surface due to the high (for MBE) doping levels.

As reported in the publication WO 2020/018895 A1 of PCT application PCT/US2019/042584, filed on Jul. 19, 2019, and which claims priority of U.S. provisional application No. 62/701,219, entitled POLARIZATION-INDUCED 2D HOLE GASES FOR HIGH-VOLTAGE P-CHANNEL TRANSISTORS, and filed on Jul. 20, 2018, the realization of high quality GaN/AlN heterostructures with p-type sheet resistances as low as 7 kΩ/sq, enabled by (1) the enormous hole charge at the binary polarization discontinuity, and (2) the precise interface obtained with Molecular Beam Epitaxy. The heterostructure of FIGS. 5a-5c was grown on an AlN-on-Sapphire template, including a 5 nm nominally undoped GaN channel to prevent impurity scattering, followed by a 10 nm heavily Mg-doped p-cap (NA≈4×10$^{19}$/cm$^3$) to lower contact resistivity. A Van der Pauw Hall measurement (by corner In dots) extracted a charge density σ≈5.8·10$^{13}$/cm$^2$ and mobility μ≈7.1 cm$^2$/Vs, for a sheet resistance of Rsh=15 kΩ/sq. The simulation in FIG. 5a, a Poisson/multiband-k·p solution from nextnano, predicts a hole density of ≈5.3·10$^{13}$/cm$^2$. Further, it is noted from simulation that nearly all the holes are confined to the first couple nanometers of the channel at the GaN/AlN interface, so the conduction can be described by a two-dimensional hole gas (2DHG) rather than a volume density. (Given the deep nature of the Mg acceptor and significant extent of the surface depletion, it is reasonable to expect—for this and similar structures—that integrated hole densities remain below 10$^{11}$ holes/cm$^2$ in the p-GaN, more than two orders smaller than the 2DHG density.)

Figures 6A, 6B:
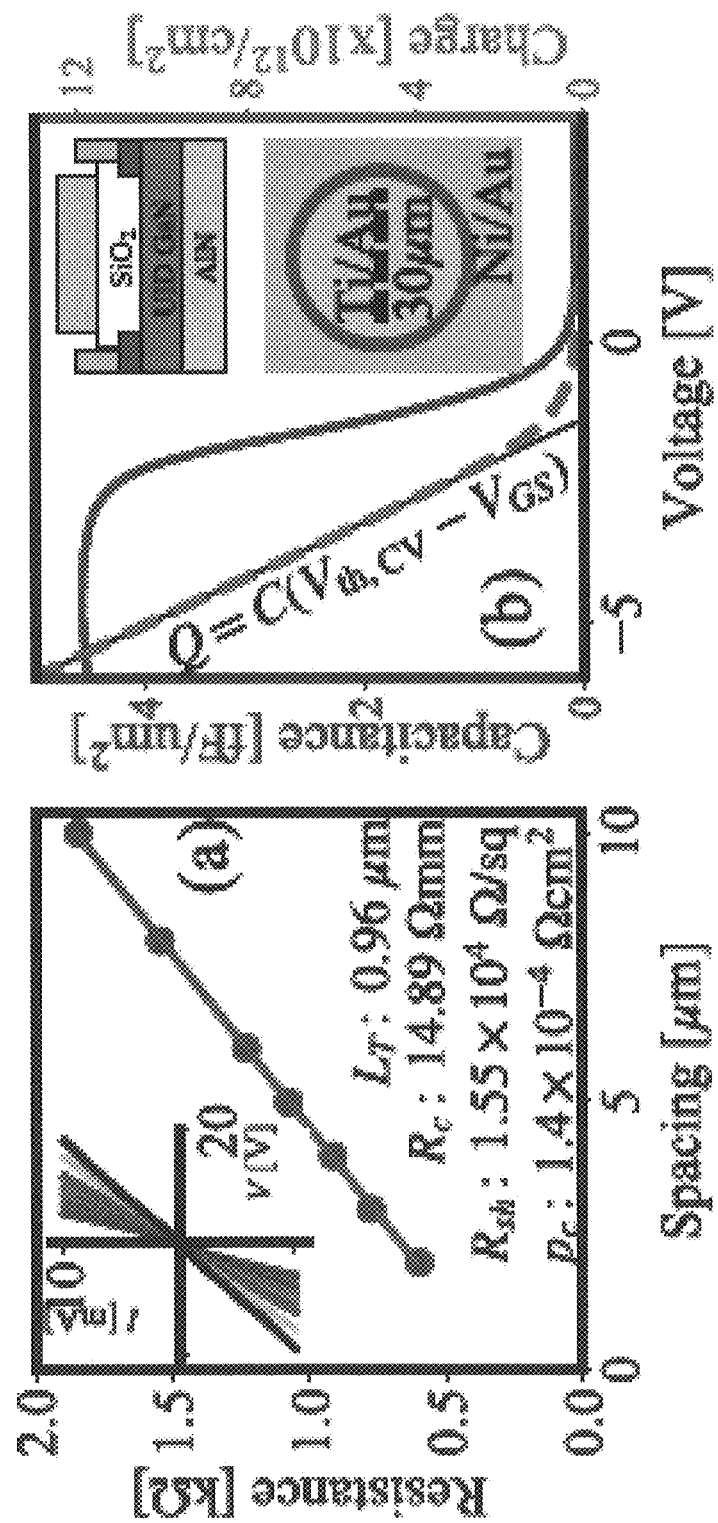
FIGS. 6a-6b are test structures: (a) TLM analysis of Ni/Au ohmic contacts. (b) C-V analysis of a large-area MISCAP; the capacitance curve (blue) shows classic normally-off p-type 2D behavior, and is integrated to form a charge curve (dashed red), which is described by a linear fit (thin black) beyond threshold.
Figures 7A, 7B, 7C:
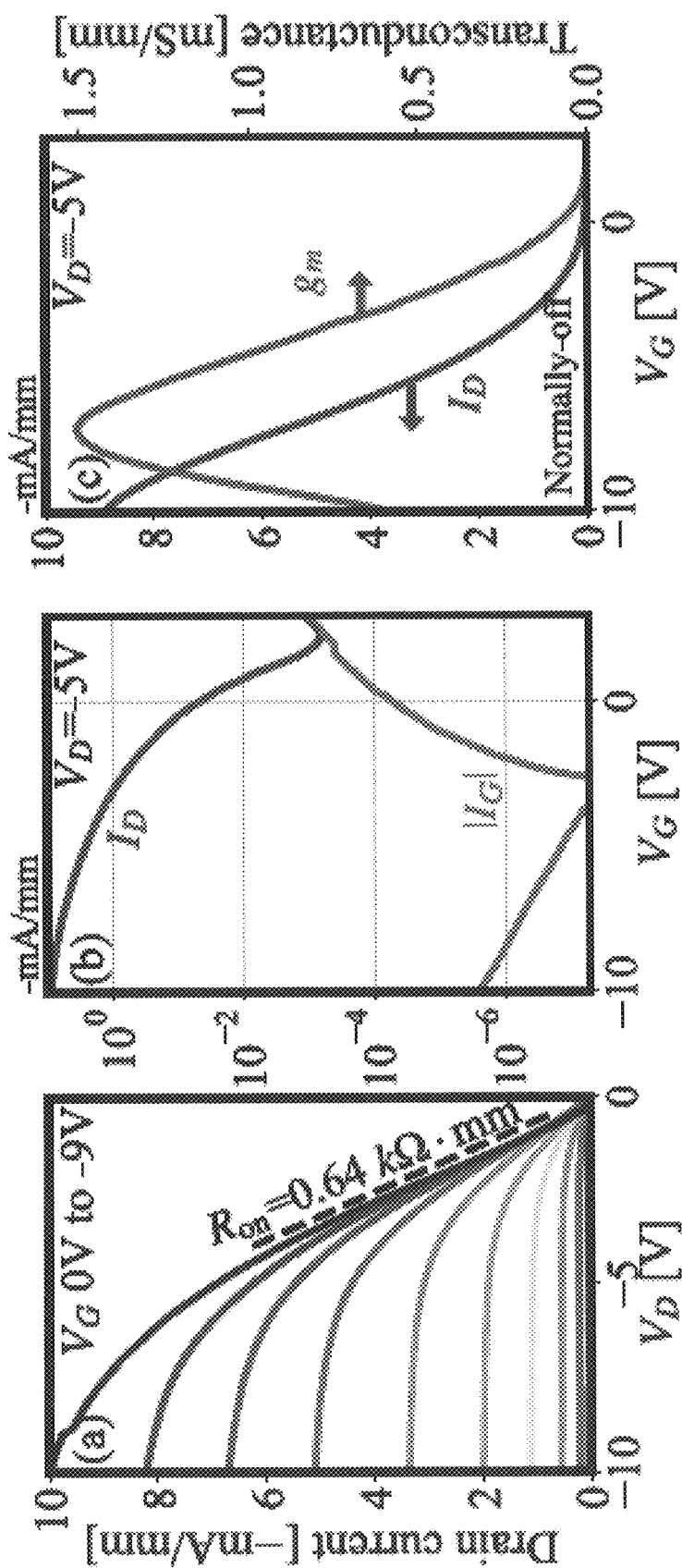
FIGS. 7a-7e are transistor characteristics of a the $L_g$=7 μm pFET; (a) Output curves show current saturation and an on-resistance of 640 Ωmm at VG=−9 V; (b) Log-scale transfer curves show four orders of on-off modulation, limited by gate leakage; linear-scale transfer curves show normally-off operation and a peak $g_m$ of 1.5 mS/mm; (d) cross-sectional schematic of the device structure, indicating the 7 um gate length defined by recess through the entire p-GaN layer, the purple dashed line marks the location of the 2D hole gas; (e) Top-view SEM image of the fabricated pFETs.
Figure 7D:
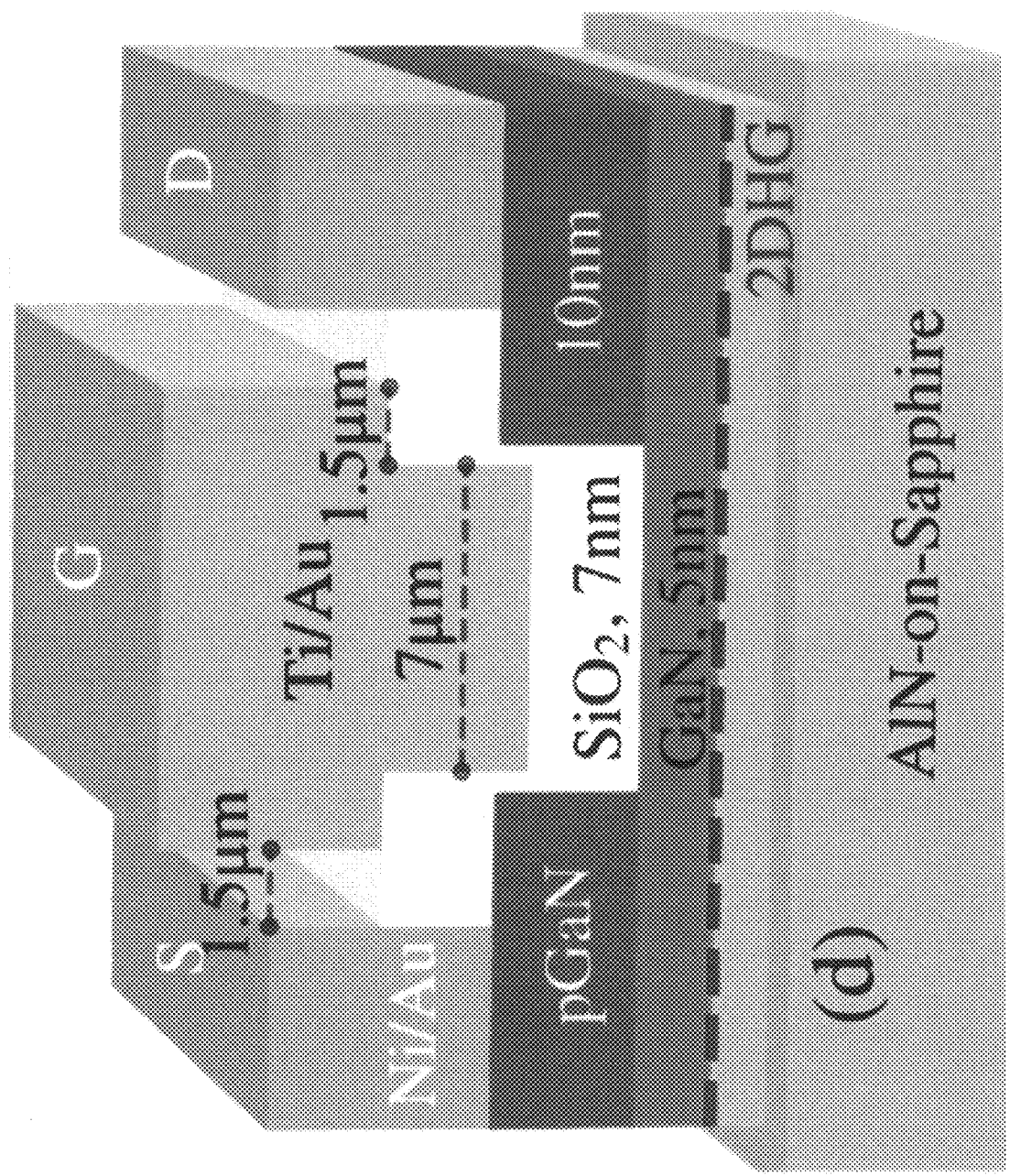
Figure 7E:
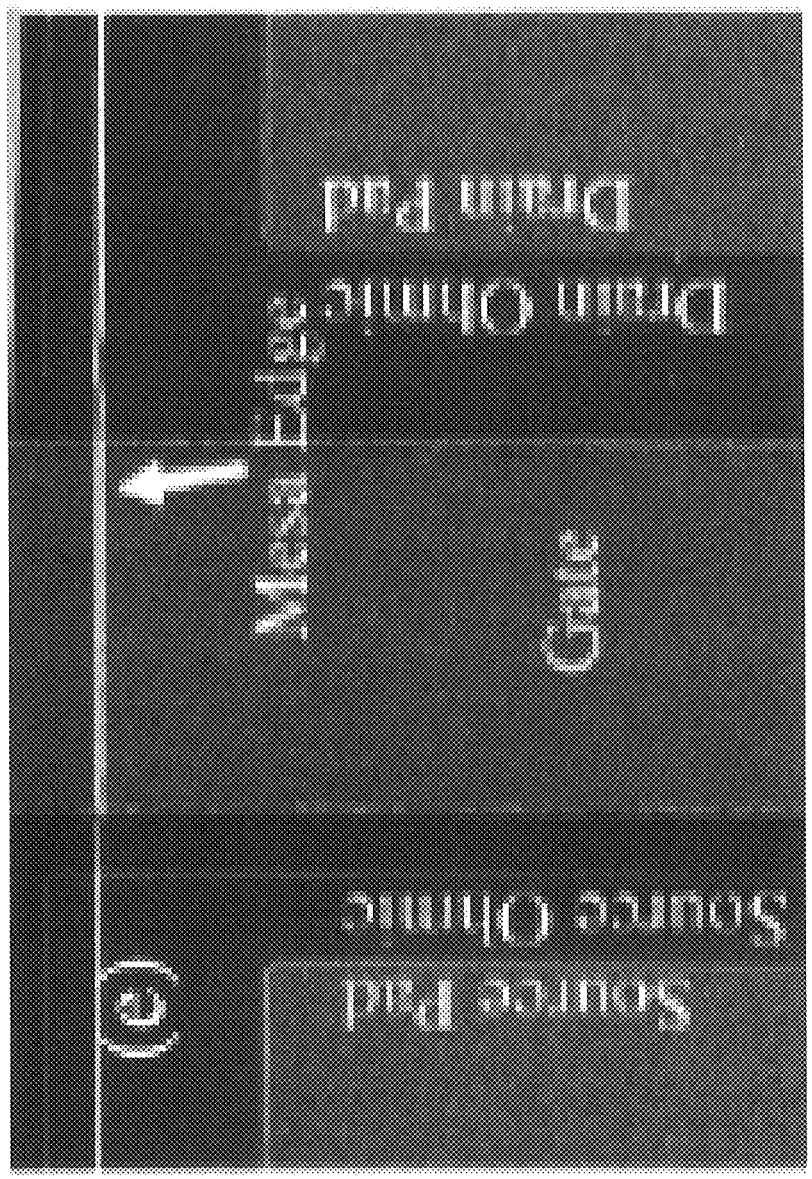

Mesa isolation was performed by a BCl3/Cl2/Ar plasma etch deep into the AlN. Following hydrochloric and hydroflouric acid cleans, Ni/Au (15/20 nm) contacts were e-beam evaporated and annealed at 450° C. in O2. Transfer-length method (TLM) patterns were measured on all dies, demonstrating excellent ohmic contacts to the 2DHG, as analyzed in FIG. 6a for a typical contact resistance, $R_c$, of 15 1/mm ($\rho_c$~10$^{-4}$ 1/cm$^2$). Gate recesses 10 nm deep were achieved by a timed, calibrated BCl3 plasma etch and confirmed with AFM. ALD SiO2 dielectric (target 7 nm) and a Ti/Au gate were deposited. (As the etch recipe has previously been observed to produce ~45° sidewalls and ALD is highly conformal, step coverage of the dielectric at the recess edge is not a major concern.) At this point, C—V structures, in FIG. 6b, showed the signature of a 2D hole gas with a negative threshold and on-state capacitance C=4.5 fF/μm$^2$.

Transistor I-V characteristics, plotted in FIG. 7a-7e, are some of the best reported for wide-gap pFETs. Clear current saturation and gate control of the wide-bandgap pFET are observed. Among E-mode GaN/AlN pFETs specifically, the previous record on-current was 4 mA/mm ($L_g$=2 μm) but required a drain voltage of −40V to be realized. Due to space-charge-limited transport, that unrecessed device showed less than 0.04 mA/mm at VD=−10 V. The 10 mA/mm shown here (for $L_g$=7 μm) at −10V is not only more than double the previous record for the platform, but qualitatively different in that the undepleted access regions pass high currents without demanding enormous drain voltages. Simultaneously, the Ion/Ioff~10$^4$ modulation is one order of magnitude larger than that previous flagship device. Comparing more broadly to the entire selection of E-mode III-Nitride pFETs, it is readily seen that this 10 mA/mm is already on par with the more-studied, more-scaled E-mode GaN/AlInGaN p-FETs (~10 mA/mm at $L_g$=1 μm). Since the high-quality contacts in this work are not limiting device performance, it is natural that with easily-achievable scaling, these on-currents should show tremendous improvement.

The experimental data is modelled as a gradual-channel drift-diffusion FET from a semi-empirical charge-control equation, Q=nCV$_{th}$ ln [1+eη(x)] with $$\eta(x) = \frac{\hat{V}(x) - V_{Gi} + \ddot{V}_T}{nV_{th}}$$

where C is the gate-channel capacitance, $V_{Gi}$, the intrinsic gate-source voltage, $V_T$ the threshold, $V_{th}$ the thermal voltage, V(x) a local potential, and n the ideality factor. The channel-integrated current is $$-I_D = \frac{W}{L_g} \mu C (nV_{th})^2 (Li_2(-e^{\eta_D}) - Li_2(-e^{\eta_S})) \quad (1)$$

$$\text{where } \eta_s = \frac{-V_{Gi} + V_T}{nV_{th}} \quad \eta_d = \frac{V_{Di} - V_{Gi} + V_T}{nV_{th}}$$

with Li$_2$(z) the dilogarithm function [24] and $V_{Di}$ the intrinsic drain-source voltage. Access/contact resistances are added to the source and drain as Rext=$R_c$+(Lsd−Lg)Rsh/2. Any further drain-induced threshold shift is accounted for by shifting $V_T$=$V_{T0}$−δ $V_{Di}$ from its low-bias value $V_{T0}$.

Figures 8A, 8B:
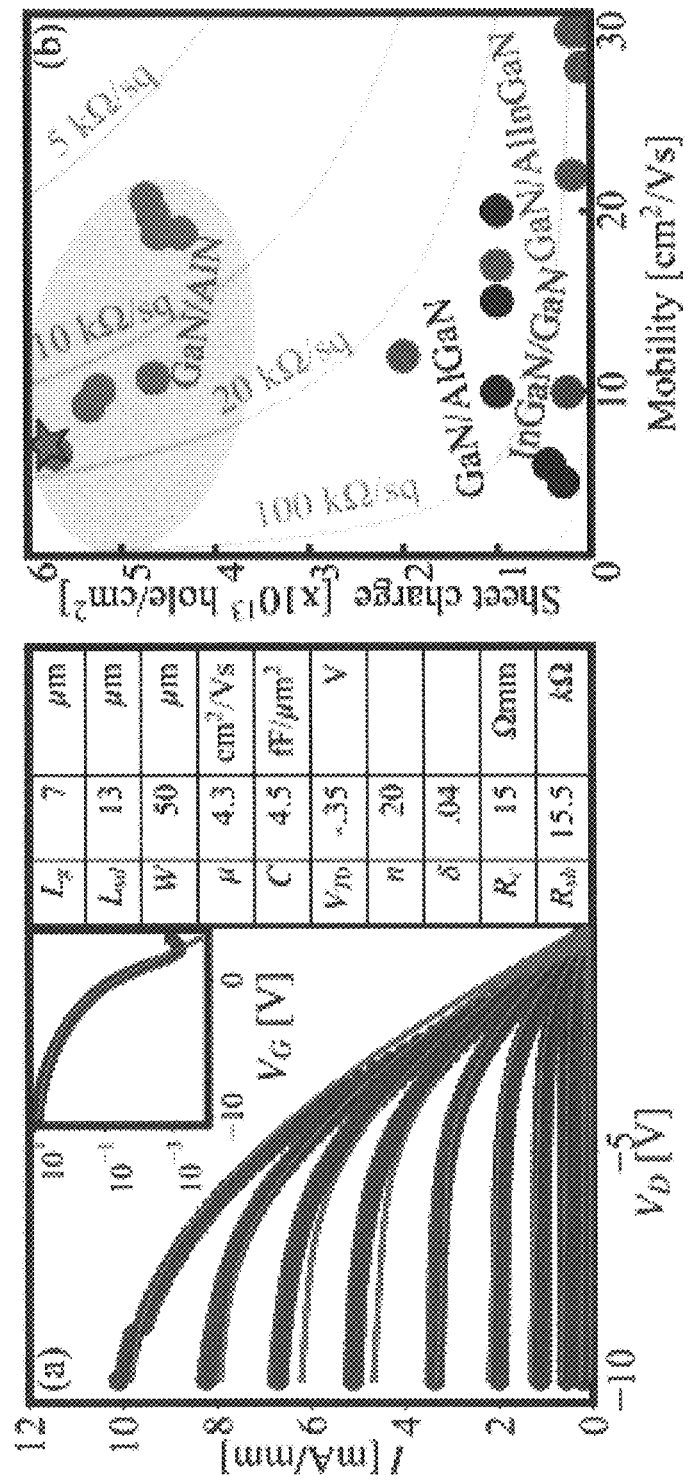
FIGS. 8a-8c represent (a) compact model (thin red) fitted to measured data (blue circles); (b) Sheet charge versus mobility for various reported III-Nitride 2D Hole Gases (see also comparison to other platforms [19]); The GaN/AlN approach has, by a significant margin, the highest sheet charge, due to the extreme polarization discontinuity and its mobility is on par with most other approaches; (c) benchmark of III-Nitride pFET performance: the on-current at VDS=−5 V is normalized by $L_g$ to ignore differences in device scale, since most reports are safely in a long-channel regime; among all E-mode devices (filled shapes), these teachings report the largest length-normalized on-current thus far, and among all GaN/AlN devices, this work represents the highest modulation.

The solid fit of this model to the measurement in FIG. 8a points out some interesting details of the device performance. First, the mobility required to satisfy the model (4.3 cm$^2$/Vs) is lower than that measured by Hall before processing (7.1 cm$^2$/Vs). There are multiple possible explanations at this point, including plasma damage from the recess etch, increase of the vertical electric field in the gated region, and the difference between Hall-effect and field-effect mobilities. Further study, such as with gentler digital etching, will be necessary to break apart these effects. Secondly, the ideality factor is quite large (20), indicating that some mechanism is reducing the efficiency of the depletion. Body capacitance should be negligible since the underlying material is ultra-widegap aluminum nitride, but the unoptimized dielectric/GaN interface (or perhaps even the GaN/AlN interface) could be contributing traps which reduce the gate efficiency. Further valence-band-focused dielectric and interface characterization will be vital to maturing this promising pFET platform.

Figure 8C:
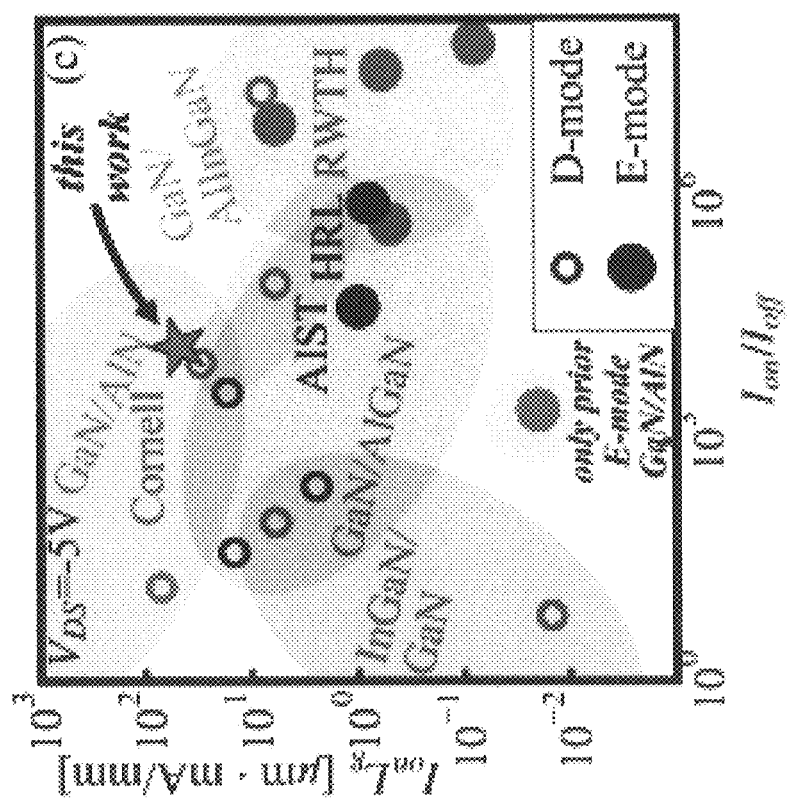

FIG. 8b, 8c benchmark the results against the literature, illuminating several points. First, among all III-Nitride structures compared in 4(b), the GaN/AlN approach, powered by the massive binary polarization difference, incorporates the highest hole density, which drastically lowers sheet resistance to the 10 kl/sq range to reduce access and contact parasitics. Consequently, see 7c, GaN/AlN enables the highest length-normalized on-currents among III-Nitride pFETs. Additionally, the large bandgaps and band offset enable a thorough pinch-off, with the insulating AlN buffer preventing parasitic n- or p-leakage.

Other have demonstrated basic CMOS inverter operation to varying degrees of success by combining extremely wide p-channel devices with narrow (and relatively low-current) n-channel devices. Nevertheless, since the best of the p-channel devices is about two orders of magnitude more resistive than the high-performance n-channel devices to which they may be coupled, further improvement is essential to making CMOS a serious possibility from a designer perspective. Toward that end, the exemplary embodiment device disclosed here offers obvious avenues for improvement, from basic scaling to gentler digital recess techniques.

Second Exemplary Embodiment

The first p-channel transistors on the GaN/AlN platform, produced by Li in 2013, came in two varieties: (1) a high-current D-mode device which hit −100 mA/mm when aggressively forced at $V_D$=−50 V, however, it could only be modulated by a factor of ~2-3×, and (2) a low-current E-mode device which was depleted everywhere by epitaxial design and thus required an excessive $V_D$=−40 V to extract only −4 mA/mm (with space-charge limited transport providing essentially no current below that voltage). In the first exemplary embodiment, the two designs are interpolated via a gate recess process to enable E-mode devices with on-currents of −10 mA/mm at a more accessible $V_D$=−10 V and with more conventional output characteristics. In this second exemplary embodiment, multiple characteristics have been combined to enable devices which can finally break the −100 mA/mm mark, but at reasonable biases with non-trivial modulation.

First, the heterostructures were grown using Plasma-assisted Molecular Beam Epitaxy (PAMBE) on an MOCVD-grown, C-plane, AlN-on-Sapphire 2-inch template. Epitaxy begins with a 500 nm AlN buffer, then continues through 15 nm of nominally-undoped GaN to form a channel, followed by 15 nm of heavily Mg-doped 5% InGaN for a contact cap. The Mg concentration is expected to exceed $5 \times 10^{19}/cm^3$ in this layer. In-situ RHEED monitoring ensured a metal-rich growth regime throughout the entire recipe. Thereafter, the wafer was diced into 8×8 mm pieces and characterized.

Figure 9:
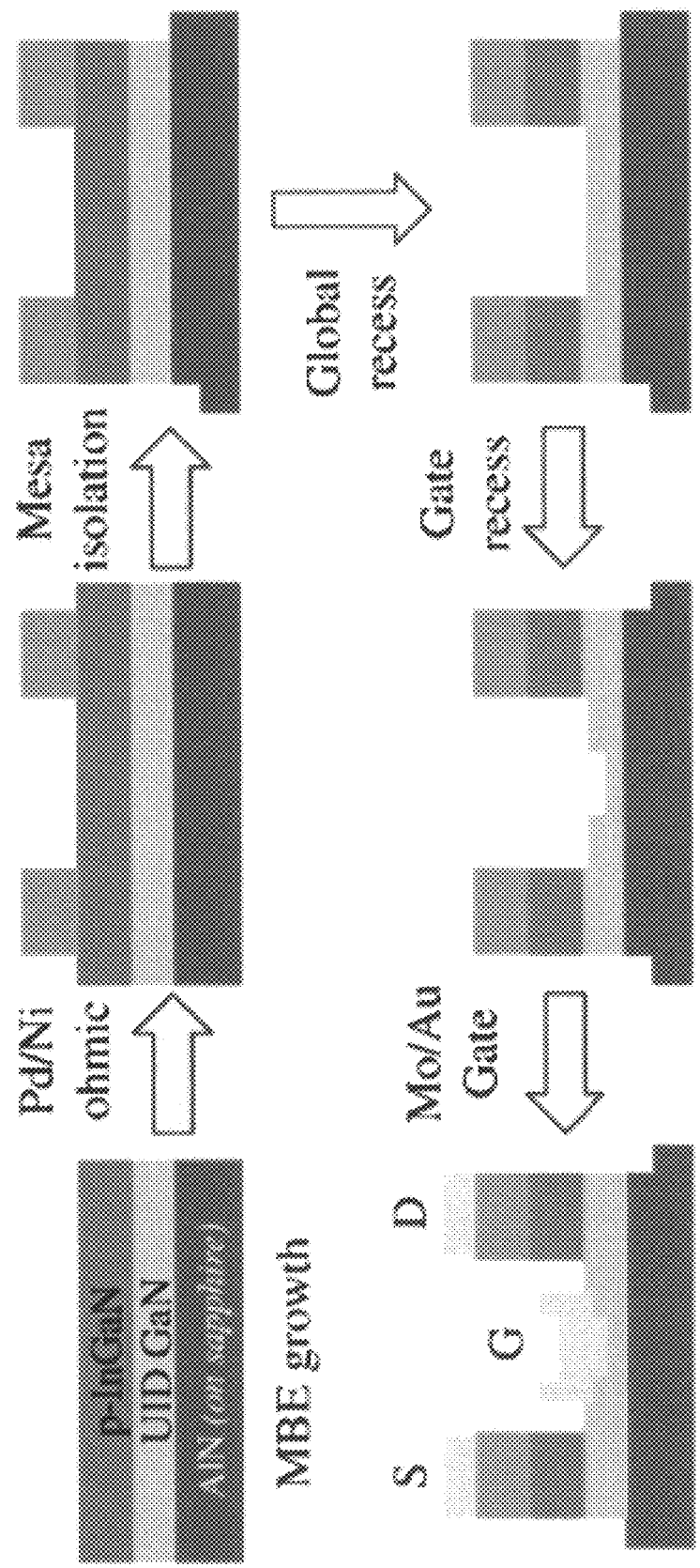
FIG. 9 shows process overview for the second exemplary embodiment.
Figures 10A, 10B, 10C, 10D:
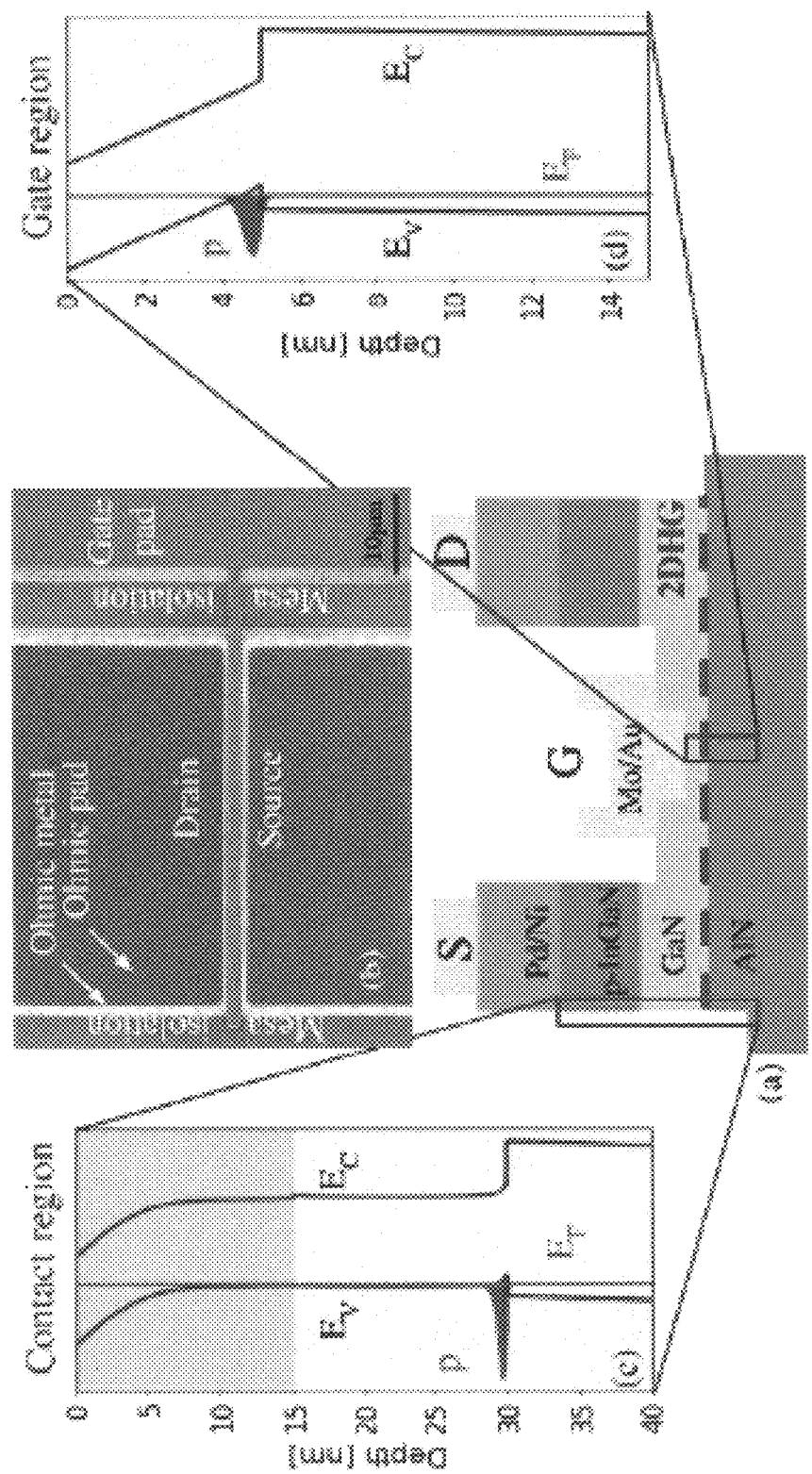
FIGS. 10A, 10B show (A) Cross-section diagram and (B) post-fabrication top-view SEM of the Schottky-gated device for the second exemplary embodiment.
FIGS. 10C, 10D show band diagrams for the (C) contact regions and (D) gated region in FIG. 10A at equilibrium, showing the confined 2D hole gas.

FIG. 9 summarizes the process flow. First, Palladium-based contacts are deposited by e-beam evaporation. As compared with previous demonstrations employing only p-GaN caps, the p-InGaN cap provides substantial reduction of contact resistance down to the $R_c$~5 Ωmm range. With specific resistivities in the low $10^{-5}$ Ωcm² range, these are on-par with the highest-quality GaN p-contact literature. Second, devices are mesa isolated by a high-rate BCl₃/Cl₂ plasma etch. Then a timed, low-damage BCl₃ two-step plasma etch refines the active region dimensions. The first step, a global recess, is masked by only the contacts, stripping the InGaN cap away to reduce gate leakage. The second step, a gate-specific recess to enable full pinchoff, is masked by a thin low-plasma-power PECVD SiO₂, which is itself patterned only by wet etch, in order to ensure no unintended overetch into the epi-layers. Throughout the process, a UV/Ozone descum is employed wherever possible to clean the surface instead of typical O₂ plasma cleanings. Finally, a Molybdenum-based gate stack is e-beam evaporated. As dielectrics are still relatively unoptimized for p-channel work in this platform, this Schottky gate approach enables much more aggressive characterization and measurement without the hysteresis and breakdown constraints typical in immature MOS devices. The resulting structure is clarified in FIG. 10A-10D. (The gate lengths given for specific devices in other figures are defined by the intended recess widths rather than the gate metal which overlaps past the recess boundaries.)

Output curves in FIGS. 11A-11C, 12A-12C show on-currents at the scale of −100 mA/mm for the smallest device, with one full order of modulation, and peak transconductance up to 19 mS/mm for a slightly larger device with two orders on/off modulation. Two devices are chosen to indicate the breadth of observed characteristics. The $L_G/L_s$=0.6/3.5 μm device in (11A-11C) is marked by a high on-current (A,C), exceeding 0.1 A/mm, and shows about 1 order on/off ratio limited by Schottky gate leakage. The $L_G/L_s$=0.8/4 μm device in (12A-12C) has on-currents which, while not as high as the first, still stand above the literature. This device also holds 2 orders on/off ratio, limited by Schottky leakage, and modulates more efficiently as a function of voltage (note different x-axes in FIGS. 11A-C vs 11A-C), resulting in an even higher peak transconductance of −19 mS/mm.

Figure 11C:
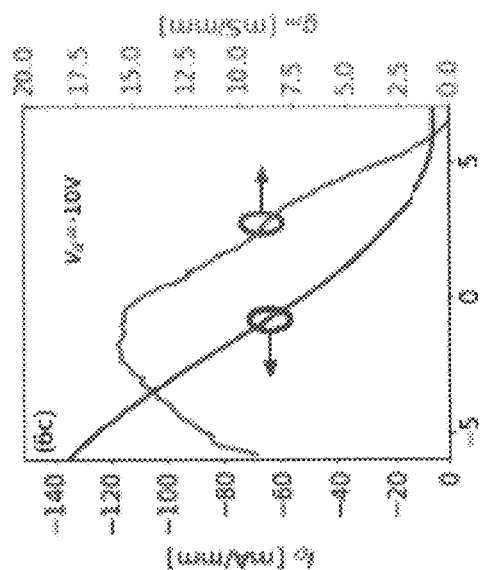
FIGS. 11A-11C and FIGS. 12A-12C show characteristics of two devices of the second exemplary embodiment.
Figure 11B:
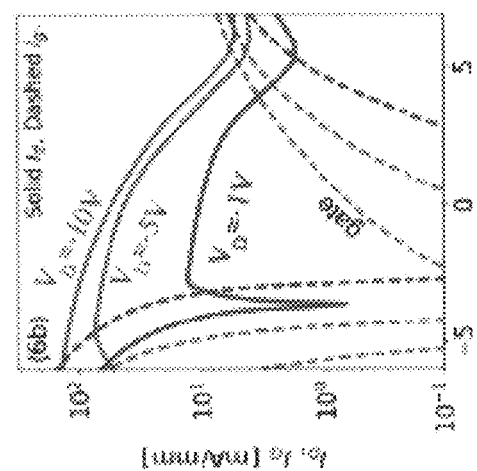
Figure 11A:
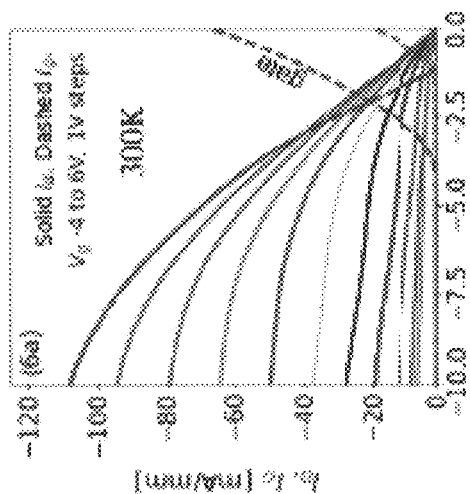
Figure 12C:
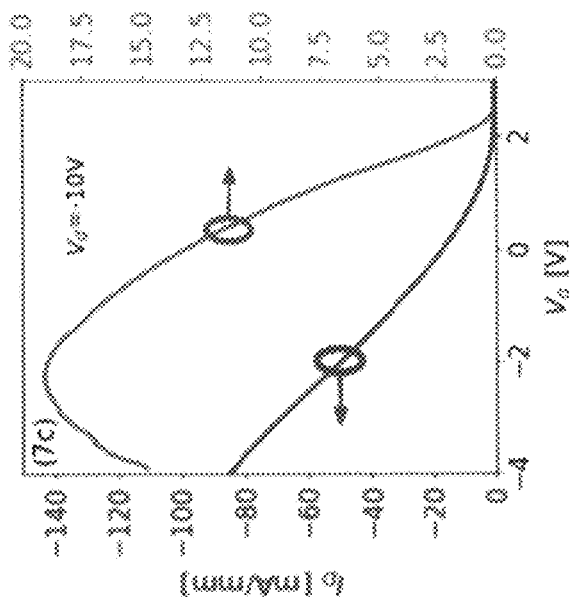
Figure 12B:
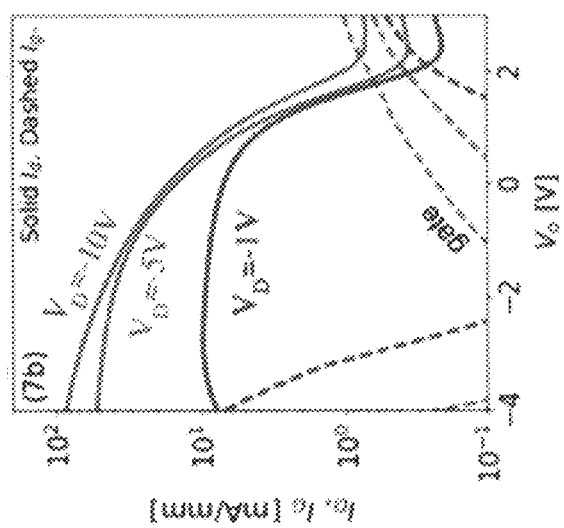
Figure 12A:
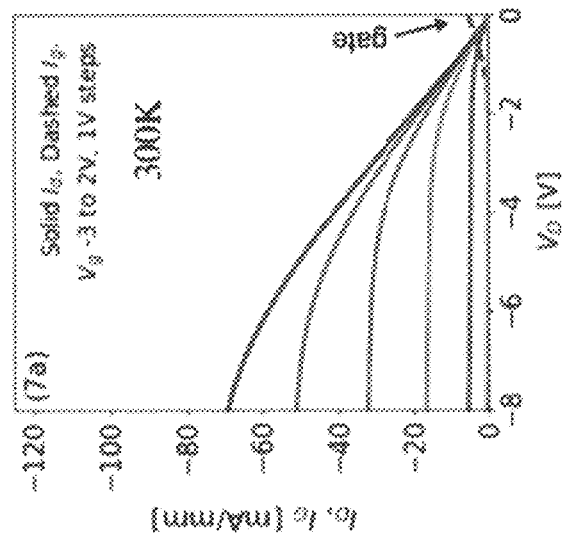

Either device alone, or any interpolation between them, gate leakage is visible in FIGS. 11A/12A when the gate is driven well beyond the drain. In fact, as seen in FIGS. 11B/12B, gate leakage limits the turn-off of both devices. However, as this is the first Schottky generation, it is important to note that this limitation is unlikely to be intrinsic: techniques such as (1) reducing the micron-scale overlap of the gate metal beyond the recess by self-aligned or e-beam lithographic processes or (2) surface treatments such as oxidation or chemical preparation prior to gate deposition may strongly affect the diode characteristics. Application of a scaled-EOT dielectric can further reduce the off-currents.

Figure 13C:
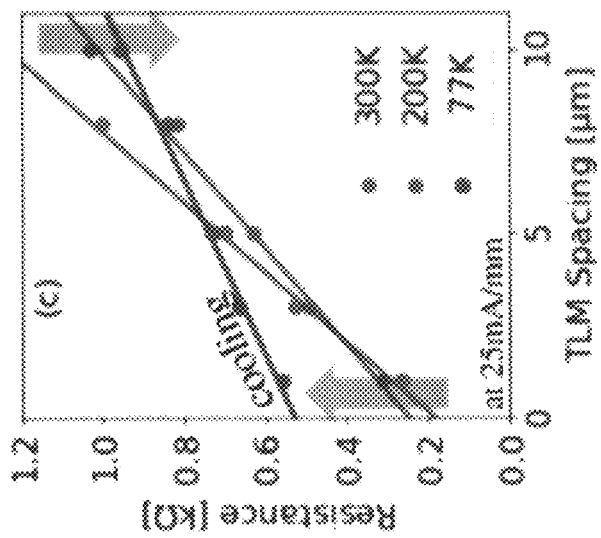
FIGS. 13A-13C show (A) Output characteristics and (B) transfer characteristics of the same device from FIGS. 11A-11C, at reduced temperature, showing on-currents enhanced nearly 3×; As can be seen in (C) T-dependent TLMs, this correlates with a reduction of sheet resistance (enhanced mobility), partially countered by an increased contact resistance.
Figure 13B:
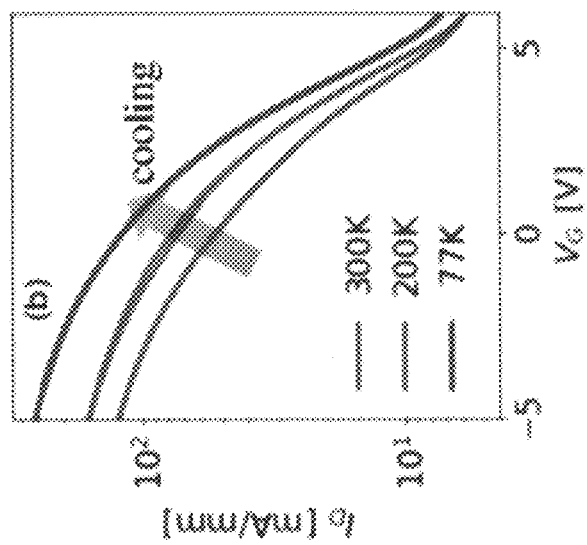
Figure 13A:
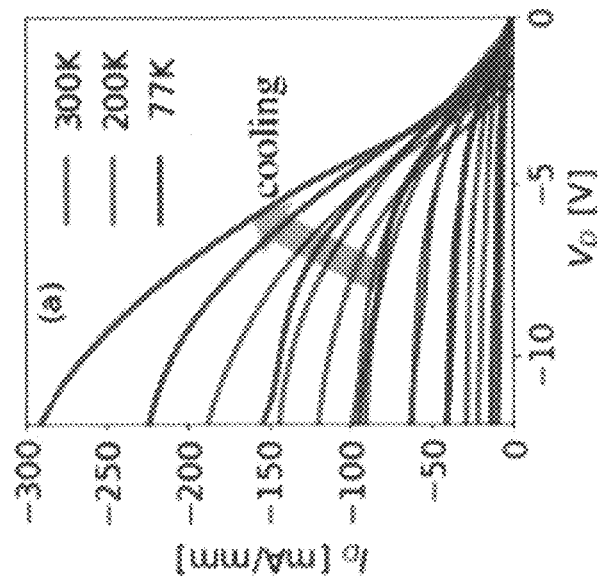

Cryogenic measurements, as in FIG. 13A, reveal dramatic current improvement up to −300 mA/mm at 77 K, far exceeding previous reports on this platform, and also (quite slightly) improve the modulation as shown in FIG. 13B. Since degenerate gas densities are roughly constant versus temperature, this can be explained in terms of an enhancement of mobility as acoustic phonon populations dwindle, only partially mitigated by an increase in contact resistance from the diminished Mg dopant ionization. Both effects are visible in the contact measurements of FIG. 13C, and the increased Schottky curvature can also be seen in the low-bias output characteristics of FIG. 13A at 77 K. Dramatic performance improvement at low-temperature signals the quality of the polarization-induced hole gas, as compared to dopant-centric approaches which favor high-temperature.

Figure 14:
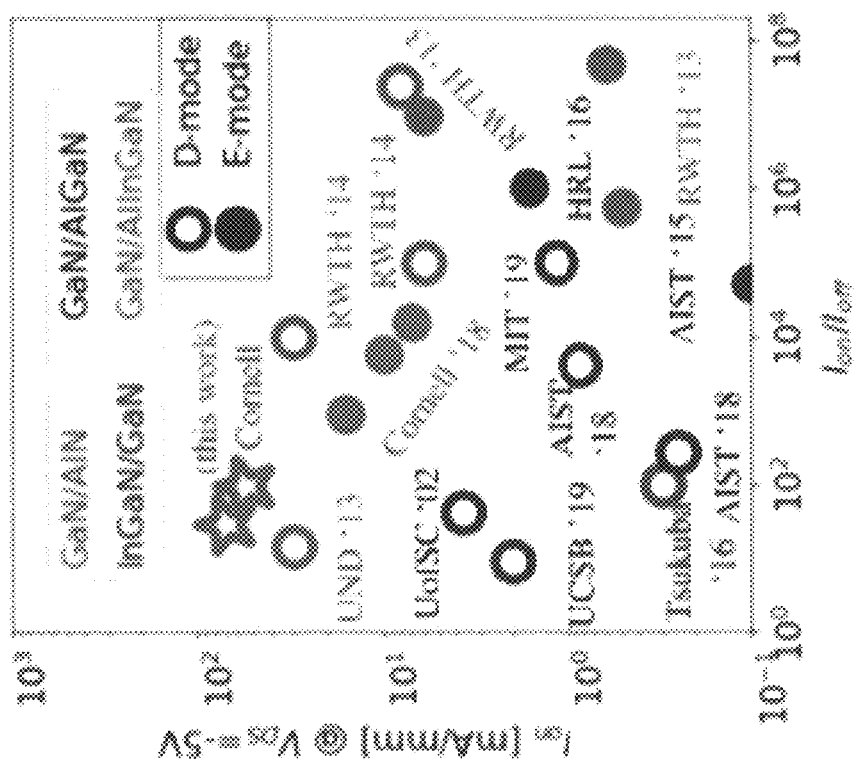
FIG. 14 shows benchmark of III-Nitride p-channel devices contextualizing the on-currents.
Figure 15:
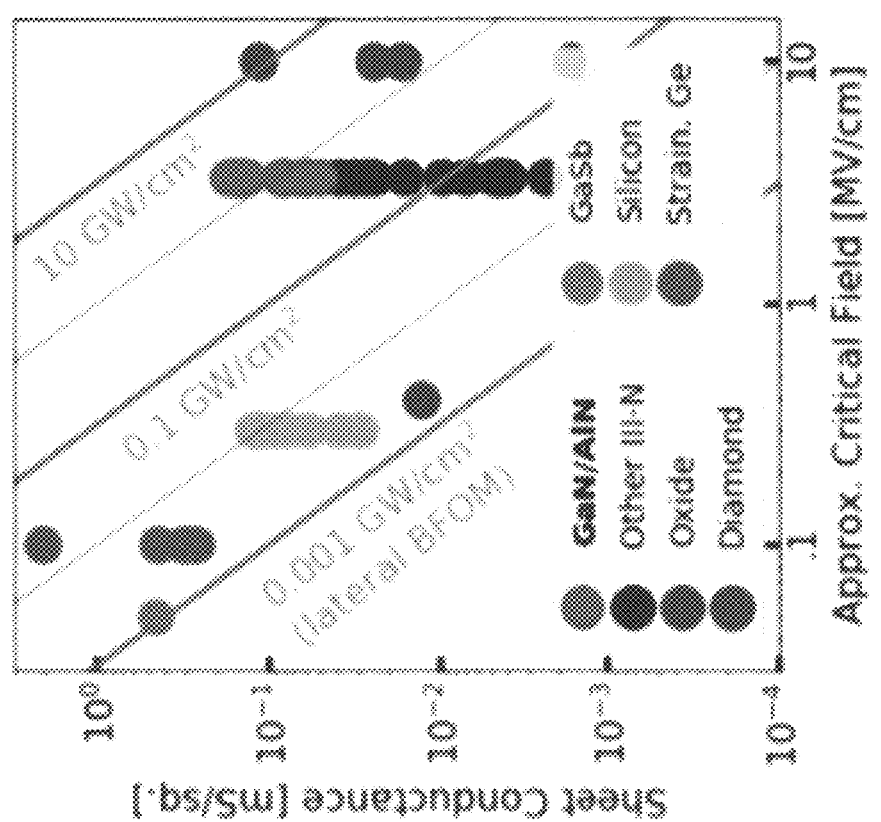
FIG. 15 shows the Beliga figure of merit plot for various 2DHG p-channel platforms, showing the material advantage of the exemplary embodiment.

Returning to room-temperature characterization, the maximum reported on-current (at $V_D$=−5 V) and best-shown on/off ratio for a collection of p-channel III-Nitride devices in the literature are benchmarked together in FIG. 14. It is readily seen that the on-currents here surpass the literature, and, any of the methods suggested above to enhance the on/off ratio, without detriment to the current, will yield a uniquely well-positioned p-channel option. For a broader comparison, high-voltage Extended-Drain pFETs in 65 nm Si CMOS technology generally reach ~200 mA/mm, so it is exciting that GaN p-HFETs are—despite significantly longer source-drain separations, unscaled gates, and more resistive contacts—now within striking distance. Stepping back, the fundamental material parameters which predict optimal high-voltage operation are plotted in terms of the Baliga Figure of Merit in FIG. 15. The high polarization-induced sheet charge combined with large bandgaps suggests a strong ultimate power limit.

Although the present invention has been described with respect to various embodiments, it should be realized that the present invention may have a wide variety of further and other embodiments that fall within the spirit and scope of the appended claims.

What is claimed is:

1. A Group III nitride semiconductor device comprising:
    a first layer of a first polar undoped Group III nitride material grown on an undoped substrate material; and
    a second layer of an undoped second polar Group III nitride material epitaxially grown on the first layer of the first polar undoped Group III nitride material;
    wherein a difference between a normal component of a polarization of the second layer of the undoped second polar Group III nitride material and the first layer of the first polar undoped Group III nitride material is negative; and wherein there is an energy band offset between valence bands of the first polar undoped Group III nitride material and the undoped second polar Group III nitride material;
    a 2D hole gas at a heterojunction between the first layer of the first polar undoped Group III nitride material and the second layer of the undoped second polar Group III nitride material;
    composition and materials of the first layer of the first polar undoped Group III nitride material and the second layer of the undoped second polar Group III nitride material selected such that the difference between a normal component of a polarization of the second layer of the undoped second polar Group III nitride material and the first layer of the first polar undoped Group III nitride material is negative and an energy band offset exists between valence bands of the first polar undoped Group III nitride material and the undoped second polar Group III nitride material, thereby causing formation the 2D hole gas at the heterojunction between the first layer of the first polar undoped Group III nitride material and the second layer of the undoped second polar Group III nitride material ;
    a first slab of p-doped third polar Group III nitride material disposed on the second layer of the undoped second polar Group III nitride material;
    a second slab of p-doped third polar Group III nitride material disposed on the second layer of the undoped second polar Group III nitride material; the second slab of p-doped third polar Group III nitride material being spaced apart from the first slab of p-doped third polar Group III nitride material;
    a first electrically conductive contact disposed over a portion of the first slab of p-doped third polar Group III nitride material;
    a second electrically conductive contact disposed over a portion of the second slab of p-doped third polar Group III nitride material; and,
    a third electrically conductive contact disposed over a surface of the second layer of the undoped second polar Group III nitride material, the surface being located between the first slab of p-doped third polar Group III nitride material and the second slab of p-doped third polar Group III nitride material and opposite a surface of the first layer of the first polar undoped Group III nitride material on which the second layer of the undoped second polar Group III nitride material is grown; the third electrically conductive contact being disposed away from the first and second electrically conductive contacts.

2. The Group III nitride semiconductor device of claim 1, wherein the first polar undoped Group III nitride material is undoped metal-polar AlN and the undoped second polar Group III nitride material is undoped metal-polar GaN.

3. The Group III nitride semiconductor device of claim 1, wherein the undoped substrate material is one of Sapphire, c-plane Sapphire, undoped bulk single crystal polar AlN, silicon carbide, Si-face silicon carbide or silicon.

4. The Group III nitride semiconductor device of claim 1, wherein a 2D electron gas is not present.

5. The Group III nitride semiconductor device of claim 1, wherein the 2D hole gas has a sheet density based upon a thickness of the second layer.

6. The Group III nitride semiconductor device of claim 1, wherein the first polar undoped Group III nitride material is undoped metal-polar AlN and the second polar Group III nitride material is one of undoped metal-polar $In_xGa_{1-x}N$ or $Al_xGa_{1-x}N$ where x is a number less than 1 and greater than 0.

7. The Group III nitride semiconductor device of claim 1, wherein the first polar undoped Group III nitride material is undoped metal-polar $Al_xGa_{1-x}N$ and the second polar Group III nitride material is one of undoped metal-polar GaN or $In_xGa_{1-x}N$ where x is a number less than 1 and greater than 0.

8. The Group III nitride semiconductor device of claim 1, wherein the first polar undoped Group III nitride material is undoped metal-polar $Al_xIn_yGa_{(1-(x+y))}N$ where x and y are numbers less than 1 and greater than 0, a sum of x and y being less than 1, and the second polar Group III nitride material is undoped metal-polar GaN.

9. The Group III nitride semiconductor device of claim 1, wherein a valence band edge of the undoped second polar Group III nitride material is more positive in energy than a valence band edge of the undoped first polar Group III nitride material.

10. The Group III nitride semiconductor device of claim 1, wherein the first polar undoped Group III nitride material is undoped metal-polar AN and the undoped second polar Group III nitride material is undoped metal-polar GaN.

11. The Group III nitride semiconductor device of claim 10, wherein the third polar Group III nitride material is metal-polar $In_xGa_{1-x}N$ where x is a number less than 1 and greater than 0.

12. The Group III nitride semiconductor device of claim 10, wherein the third polar Group III nitride material is metal-polar GaN.

13. The Group III nitride semiconductor device of claim 1, wherein the first polar undoped Group III nitride material is undoped N-polar GaN and the second polar undoped Group III nitride material is undoped N-polar MN.

14. The Group III nitride semiconductor device of claim 1, wherein the third electrically conductive contact is disposed away from the first slab of p-doped third polar Group III nitride material and the second slab of p-doped third polar Group III nitride material.

15. The Group III nitride semiconductor device of claim 1, further comprising an insulating layer disposed on a section of each one of first slab of p-doped third polar Group III nitride material and the second slab of p-doped third polar Group III nitride material that is not covered by the first electrically conductive contact and the second electrically conductive contact, disposed on a sidewall of the first slab of p-doped third polar Group III nitride material and an opposing sidewall of the second slab of p-doped third polar Group III nitride material, and disposed on the surface of the second layer of the undoped second polar Group III nitride material, the surface being located between the first slab of p-doped third polar Group III nitride material and the second slab of p-doped third polar Group III nitride material;
the third electrically conductive contact being disposed over the insulating layer; the third electrically conductive contact being disposed away from the first and second electrically conductive contacts.

16. The Group III nitride semiconductor device of claim 1, wherein the second layer of the undoped second polar Group III nitride material has an indentation extending from a first surface on which the first slab of p-doped third polar Group III nitride material and the second slab of p-doped third polar Group III nitride material are disposed to a second surface disposed between the first surface and a surface in contact with the first layer of a first polar undoped Group III nitride material; the indentation disposed between the first and second slabs of p-doped second polar Group III nitride material; and
wherein the third electrically conductive contact substantially fills the indentation in the second layer of the undoped second polar Group III nitride material.

17. The Group III nitride semiconductor device of claim 16, wherein the third electrically conductive contact is disposed away from the first slab of p-doped third polar Group III nitride material and the second slab of p-doped third polar Group III nitride material.

18. The Group III nitride semiconductor device of claim 16, wherein the third electrically conductive contact is disposed in contact with the first slab of p-doped third polar Group III nitride material and the second slab of p-doped third polar Group III nitride material.

19. The Group III nitride semiconductor device of claim 1, wherein the second layer of the undoped second polar Group III nitride material has an indentation extending from a first surface on which the first slab of p-doped third polar Group III nitride material and the second slab of p-doped third polar Group III nitride material are disposed to a second surface disposed between the first surface and a surface in contact with the first layer of a first polar undoped Group III nitride material; the indentation disposed between the first and second slabs of p-doped second polar Group III nitride material;
wherein the Group III nitride semiconductor device further comprises an insulating layer disposed on a section of each one of first slab of p-doped third polar Group III nitride material and the second slab of p-doped third polar Group III nitride material that is not covered by the first electrically conductive contact and the second electrically conductive contact, disposed on a sidewall of the first slab of p-doped third polar Group III nitride material and an opposing sidewall of the second slab of p-doped third polar Group III nitride material, and disposed on bottom and sidewall surfaces of the indentation;
the third electrically conductive contact being disposed over the insulating layer; the third electrically conductive contact being disposed away from the first and second electrically conductive contacts.

20. The Group III nitride semiconductor device of claim 19, wherein the insulating layer is also disposed over a sidewall of the first electrically conductive contact that is opposite a sidewall of the second electrically conductive contact, over a portion of a surface of the first electrically conductive contact that is opposite a surface disposed on the first slab of p-doped third polar Group III nitride material; the portion extending from the sidewall of the first electrically conductive contact that is opposite a sidewall of the second electrically conductive contact, over the sidewall of the second electrically conductive contact that is opposite the sidewall of the first electrically conductive contact, and over a portion of a surface of the second electrically conductive contact that is opposite a surface disposed on the second slab of p-doped third polar Group III nitride material; the portion extending from the sidewall of the second electrically conductive contact that is opposite a sidewall of the first electrically conductive contact; and,
wherein the third electrically conductive contact being disposed over at least a portion of the insulating layer.

21. The Group III nitride semiconductor device of claim 1, wherein the second layer of the undoped second polar Group III nitride material has an indentation extending from a first surface on which the first slab of p-doped third polar Group III nitride material and the second slab of p-doped third polar Group III nitride material are disposed to a second surface disposed between the first surface and a surface in contact with the first layer of a first polar undoped Group III nitride material; the indentation disposed away from the first and second slabs of p-doped second polar Group III nitride material;
wherein the Group III nitride semiconductor device further comprises an insulating layer disposed on a section of a first surface of the second layer of the undoped second polar Group III nitride material on which the second layer of the undoped second polar Group III nitride material is not covered by the first slab of p-doped third polar Group III nitride material and the second slab of p-doped third polar Group III nitride material, disposed on surfaces of the indentation;
the third electrically conductive contact being disposed over the insulating layer; the third electrically conductive contact being disposed away from the first and second electrically conductive contacts.

22. The Group III nitride semiconductor device of claim 21, wherein the insulating layer is also disposed over a sidewall of first slab of p-doped third polar Group III nitride material that is opposite a sidewall of the second slab of p-doped third polar Group III nitride material, over a sidewall of the first electrically conductive contact that is opposite a sidewall of the second electrically conductive contact, over a portion of a surface of the first electrically conductive contact that is opposite a surface disposed on the first slab of p-doped third polar Group III nitride material, the portion extending from the sidewall of the first electrically conductive contact that is opposite a sidewall of the second conductive contact, over the sidewall of the second slab of p-doped third polar Group III nitride material that is opposite the sidewall of the first slab of p-doped third polar Group III nitride material, over the sidewall of the second electrically conductive contact that is opposite the sidewall of the first electrically conductive contact, and over a portion of a surface of the second electrically conductive contact that is opposite a surface disposed on the second slab of p-doped third polar Group III nitride material, the portion extending from the sidewall of the second electrically conductive contact that is opposite the sidewall of the first conductive contact; and, wherein the third electrically conductive contact being disposed over at least a portion of the insulating layer.

23. The Group III nitride semiconductor device of claim 1 wherein the undoped substrate material, the first layer of a first polar undoped Group III nitride material grown on the undoped substrate material, and the undoped second polar Group III nitride material extend beyond the Group III nitride semiconductor device, thereby providing a platform for growing other semiconductor device;

at least one other semiconductor device being grown on the platform.

24. The Group III nitride semiconductor device of claim 23 wherein the at least one other semiconductor device is an nFET selected from one of a MOSFET, MESFET, a JFET, or a HEMT.

25. The Group III nitride semiconductor device of claim 24 wherein the nFET includes a 2D electron gas.

* * * * *